United States Patent [19]
Hiiro

[11] Patent Number: 5,600,666
[45] Date of Patent: Feb. 4, 1997

[54] LASER BEAM SCANNING RADIATING APPARATUS

[75] Inventor: Hiroyuki Hiiro, Kanagawa-ken, Japan

[73] Assignee: Fuji Photo Film Co., Ltd., Kanagawa-ken, Japan

[21] Appl. No.: 372,125

[22] Filed: Jan. 13, 1995

[30] Foreign Application Priority Data

Jan. 13, 1994 [JP] Japan .................................. 6-001950
Jul. 6, 1994 [JP] Japan .................................. 6-154738
Nov. 4, 1994 [JP] Japan .................................. 6-270789

[51] Int. Cl.$^6$ .................................................. H01S 3/10
[52] U.S. Cl. ........................... 372/24; 372/108; 372/101; 372/98; 372/26; 372/100
[58] Field of Search .................................. 372/92, 99, 98, 372/108, 101, 24, 26, 100

[56] References Cited

U.S. PATENT DOCUMENTS 3,992,681  11/1976  Haun, Jr. et al. .

FOREIGN PATENT DOCUMENTS 2535535  10/1982  France .
93/13564  of 0000  WIPO .
94/04375  of 0000  WIPO .
92/03862  3/1992   WIPO .

OTHER PUBLICATIONS

Optics Letter—"Diode–pumped Microchip Lasers Electro-optically Q Switched At High Pulse Repetition Rates", vol. 17, No. 17, Oct. 1992, New York, J. J. Zayhowski et al.

"Solid–State Laser Engineering"—'Q–Switches and External Switching Devices', W. Koechner, pp. 402–448.

Cleo Conference—"Diode–pumped Electro-optically Q–Switched Mircochip Lasers", May 1992, J. J. Zayhowski et al.

Exhibit A—Text filed at USPTO corresponding to FR 93 13564.

Exhibit B—U.S. Serial No. 08/227,283, filed Apr. 13, 1994, corresponding to FR 93 04375.

Primary Examiner—Leon Scott, Jr.

[57] ABSTRACT

A laser beam source radiates out laser beams such that they may intersect one another with predetermined angular spectra on a predetermined virtual plane. A Fourier transform lens array optical system, which is located in the vicinity of the virtual plane, divides the laser beams having impinged upon the virtual plane into small regions and carries out Fourier transform of the small regions. Phase modulators modulate the phases of the laser beams divided into the small regions such that the wave fronts of the laser beams after being subjected to the Fourier transform may have the same phase with respect to a predetermined direction as a whole. A scanning drive device drives the phase modulators such that the directions of travel of the laser beams radiated out of the Fourier transform lens array optical system may be changed. A first resonator mirror is located at a position that receives the scanned laser beams. A second resonator mirror is located at a position rearward from the laser beam source.

24 Claims, 15 Drawing Sheets

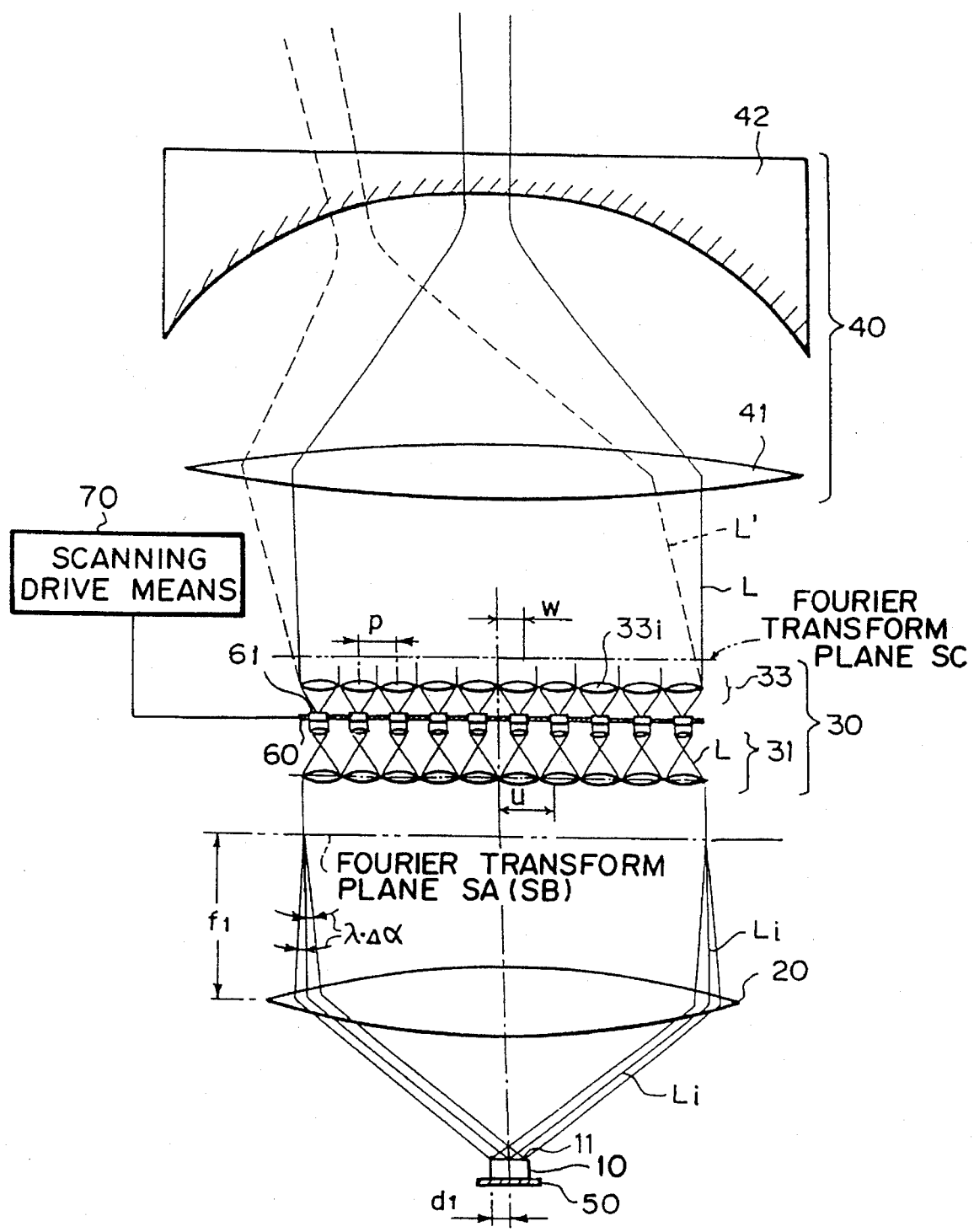
F I G. 1

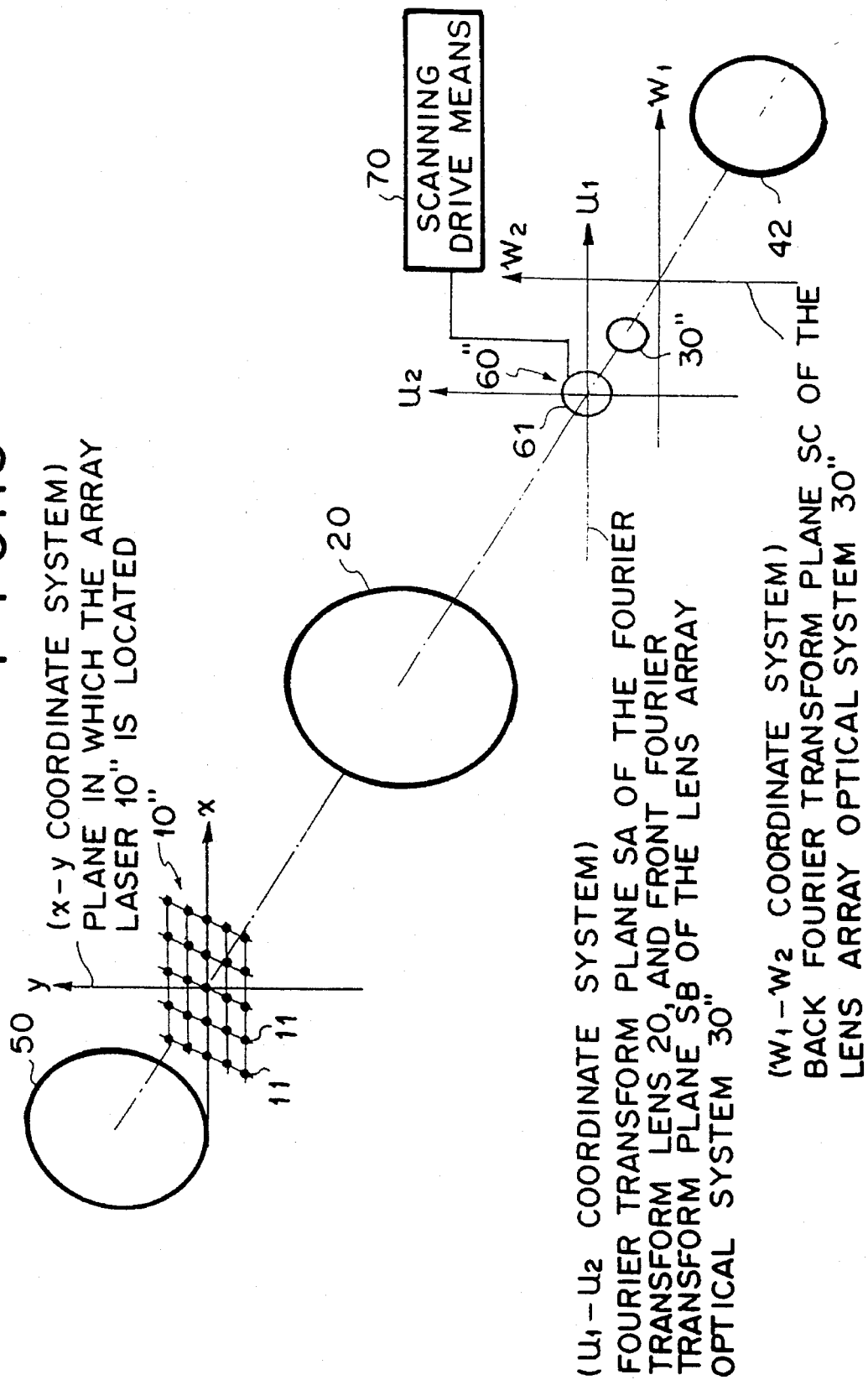

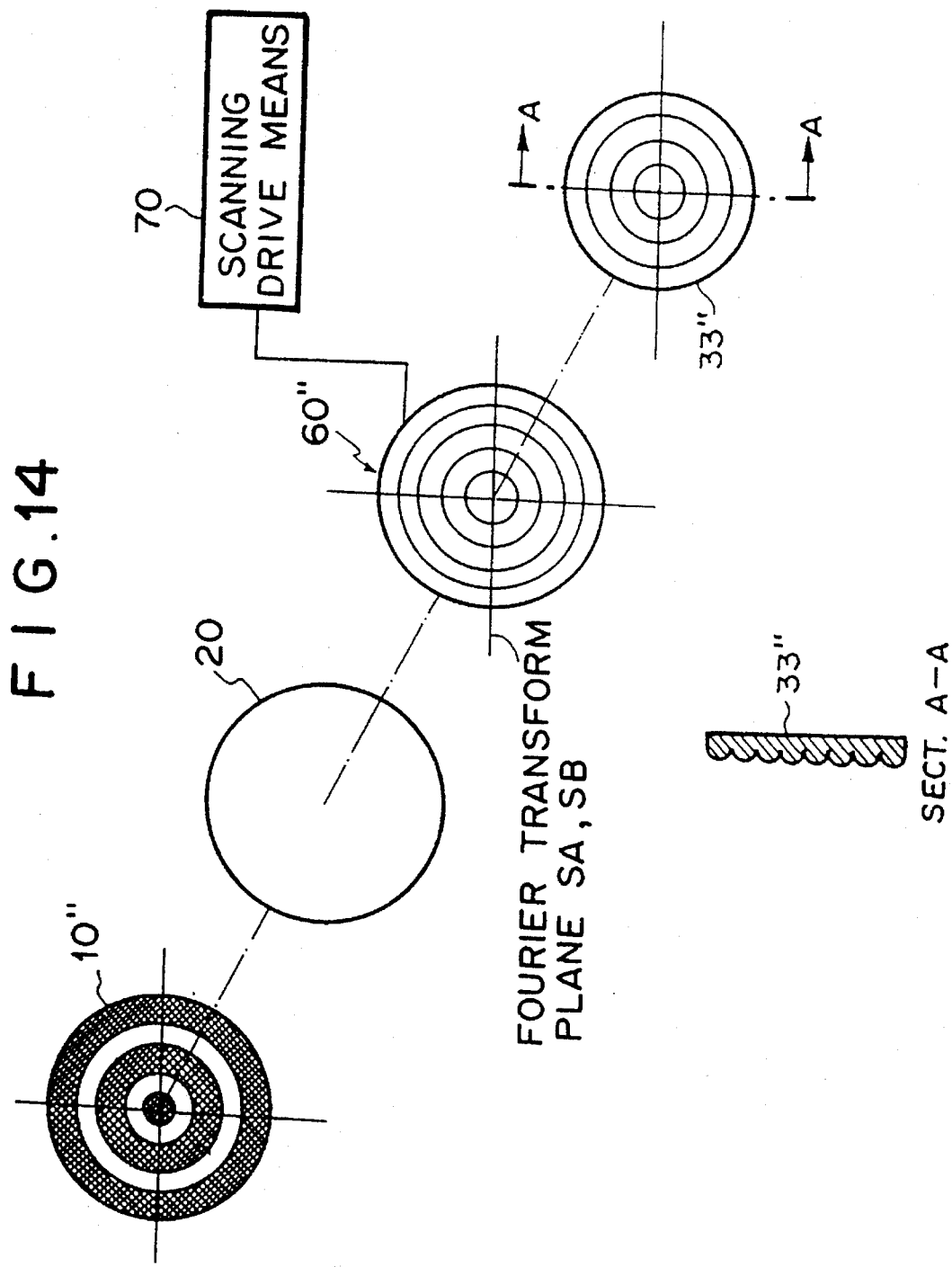

LASER BEAM SCANNING RADIATING APPARATUS

BACKGROUND OF THE INVENTION

1. Field of the Invention

This invention relates to a laser beam scanning radiating apparatus. This invention particularly relates to a laser beam scanning radiating apparatus, which is of the external resonator type and has no mechanical movable part.

2. Description of the Prior Art

Lasers have heretofore been used as scanners, and the like, in various fields in order to read out information from media, on which the information has been recorded, or to record information on recording media.

In the laser used as the scanner, a laser beam is radiated in a single predetermined direction from the laser apparatus. The laser beam, which has been radiated out in the predetermined direction, impinges upon a scanning system, such as a rotating polygon mirror or a light deflector utilizing a galvanometer mirror, and is reflected to the direction in accordance with the direction of rotation of the rotating polygon mirror or the direction of deflection of the light deflector. In this manner, the laser beam is scanned. Ordinarily, the scanning is carried out in one-dimensional direction. Also, when necessary, the scanning is carried out in two-dimensional directions by combining the one-dimensional scanning system and a different scanning system, which carries out the scanning in a direction different from the scanning direction of the one-dimensional scanning system.

However, with the conventional scanning system, which is provided with mechanical movable parts, such as the rotating parts, the scanning stability is limited to a certain level, and it is not always possible to keep the scanning accuracy high while the scanning speed is being kept high. Also, with a single scanning system, only the one-dimensional scanning can be carried out, and the scanning in two-dimensional directions or in more directions cannot be carried out. Further, in cases where a plurality of laser beams respectively radiated out of a plurality of laser beam sources are scanned simultaneously such that a large amount of scanning light may be obtained, it is necessary to use modulating devices, and it is difficult to accurately control the space between the laser beams, or the like.

SUMMARY OF THE INVENTION

The primary object of the present invention is to provide a laser beam scanning radiating apparatus, wherein no mechanical movable part is used, and the scanning stability and the scanning speed can be kept high.

Another object of the present invention is to provide a laser beam scanning radiating apparatus, wherein the scanning can be carried out in two-dimensional directions or in more directions, and a large amount of scanning light is obtained by easily combining a plurality of laser beams with one another.

The present invention provides a laser beam scanning radiating apparatus comprising:

i) a laser beam source for radiating out a plurality of laser beams such that the laser beams may intersect one another with predetermined angular spectra on a predetermined virtual plane, through which the laser beams pass, ii) a Fourier transform lens array optical system, which is located in the vicinity of the virtual plane, and which divides the laser beams having impinged upon the virtual plane into small regions and carries out Fourier transform of the small regions, iii) an array-like phase modulating means, which modulates each of the phases of the laser beams having been divided into the small regions, such that the wave fronts of the plurality of the laser beams after having been subjected to the Fourier transform in the Fourier transform lens array optical system may have the same phase with respect to a predetermined direction as a whole, iv) a scanning drive means, which drives the phase modulating means such that the directions of travel of the laser beams having been radiated out of the Fourier transform lens array optical system may be changed, and v) a laser resonator mirror optical system comprising:
   a) a first laser resonator mirror, which is located at a position that receives the laser beams having been scanned by the scanning drive means, and which reflects the laser beams having been scanned, and
   b) a second laser resonator mirror, which is located at a position rearward from the laser beam source, wherein the focal length of the Fourier transform lens array optical system, the array pitch of the Fourier transform lens array optical system, the number of the plurality of the laser beams radiated out of the laser beam source, the wavelength of the laser beams, and the variation of the angular spectrum of each of the laser beams at the respective positions, at which the laser beams intersect one another, are set such that a plurality of Fourier transformed patterns of the laser beams, which patterns are reproduced on the Fourier transform plane of the Fourier transform lens array optical system, may stand in a line at a predetermined pitch as a whole.

With the laser beam scanning radiating apparatus in accordance with the present invention, a coherent combined laser beam having a single wave front can be obtained from the laser beams, which have been radiated out of the Fourier transform lens array optical system. Also, the coherent combined laser beam having the single wave front can be scanned in a predetermined direction inclined with respect to the optical axis. The term "predetermined direction inclined with respect to an optical axis" as used herein embraces the optical axis direction in its scope. As described above, the Fourier transform lens array optical system is located in the vicinity of the virtual plane. This means that the Fourier transform lens array optical system is located such that its Fourier transform plane and the virtual plane may be close to each other or may coincide with each other.

The first laser resonator mirror is constituted of a semi-transparent mirror having a low transmittance, or the like. When the gain in the resonator structure exceeds the loss, the laser beams are amplified while they are being repeatedly reflected in the laser resonator mirror optical system. Part of the amplified laser beams passes through the first laser resonator mirror and is radiated out of the laser beam scanning radiating apparatus.

Also, in the laser beam scanning radiating apparatus in accordance with the present invention, the value of the product of the array pitch of the Fourier transform lens array optical system and the variation of the angular spectrum of each of the laser beams at the respective positions, at which the laser beams intersect one another, may be set to be equal to a value, which falls within the range of larger than 0 to smaller than 2, such that the intensity distribution pattern of the combined laser beam, which occurs from optical coupling of the plurality of the laser beams, may become approximately perfectly single-lobed. In such cases, a coherent combined laser beam having the same phase and a high output power can be obtained. In cases where the value of the product of the array pitch of the Fourier transform lens array optical system and the variation of the angular spectrum of each of the laser beams is set to be equal to a value, which falls within the range of larger than 0 to smaller than 2 and which is other than 1, it is necessary to modulate each of the phases of the laser beams of the respective small regions such that the wave fronts of the laser beams after having passed through the Fourier transform lens array optical system may be smoothly connected with one another as a whole. In cases where the value of the product of the array pitch of the Fourier transform lens array optical system and the variation of the angular spectrum of each of the laser beams is set to be equal to 1, the phase modulation described above need not be carried out. Therefore, the value of the product should preferably be set to be equal to 1.

The laser beam source employed in the laser beam scanning radiating apparatus in accordance with the present invention may be an array laser beam source comprising an array of a plurality of laser beam sources, which respectively radiate out the laser beams. Alternatively, the laser beam source employed in the laser beam scanning radiating apparatus in accordance with the present invention may be a bulk-like laser beam source (i.e. a bulk-like laser medium) capable of radiating out the laser beams from arbitrary positions lying in a plane, which is parallel to the predetermined virtual plane.

Further, in the laser beam scanning radiating apparatus in accordance with the present invention, a Fourier transform lens may be located between the back end face of the laser beam source and the second laser resonator mirror such that a Fourier transform plane of the Fourier transform lens may coincide with the back end face of the laser beam source, whereby each of the laser beams, which have been reflected by the first laser resonator mirror and have thus been entered into the laser beam source and which have then been radiated out of the back end face of the laser beam source, is reflected and again caused to enter into the laser beam source from its back end face by the Fourier transform lens and the second laser resonator mirror as a phase-conjugate laser beam, and is thereafter radiated out of the laser beam source as a laser beam, which is phase-conjugate with respect to the phase distribution of the laser beam having been reflected by the first laser resonator mirror and having thus been entered into the laser beam source.

With the aforesaid configuration of the laser beam scanning radiating apparatus in accordance with the present invention, wherein the Fourier transform lens is located between the back end face of the laser beam source and the second laser resonator mirror, the phase distribution of the laser beam, which has been reflected by the first laser resonator mirror and has thus been entered into the laser beam source and which has again been radiated out of the laser beam source, i.e. the laser beam having made a round trip, can be kept the same as the phase distribution of the original laser beam.

Also, the same effects as those of the aforesaid configuration can be obtained with the modifications of the laser beam scanning radiating apparatus in accordance with the present invention, which are described below. Specifically, in the laser beam scanning radiating apparatus in accordance with the present invention, a collimator lens array and a prism may be located between the back end face of the laser beam source and the second laser resonator mirror, and the second laser resonator mirror may be located on reflecting surfaces of the prism, whereby each of the laser beams, which have been reflected by the first laser resonator mirror and have thus been entered into the laser beam source and which have then been radiated out of the back end face of the laser beam source, is reflected and again caused to enter into the laser beam source from its back end face by the collimator lens array and the prism as a phase-conjugate laser beam, and is thereafter radiated out of the laser beam source as a laser beam, which is phase-conjugate with respect to the phase distribution of the laser beam having been reflected by the first laser resonator mirror and having thus been entered into the laser beam source.

As a further alternative, in the laser beam scanning radiating apparatus in accordance with the present invention, the second laser resonator mirror may be constituted of a phase-conjugate mirror, and a converging optical system may be located between the back end face of the laser beam source and the phase-conjugate mirror, whereby each of the laser beams, which have been reflected by the first laser resonator mirror and have thus been entered into the laser beam source and which have then been radiated out of the back end face of the laser beam source, is reflected and again caused to enter into the laser beam source from its back end face by the converging optical system and the phase-conjugate mirror as a phase-conjugate laser beam, and is thereafter radiated out of the laser beam source as a laser beam, which is phase-conjugate with respect to the phase distribution of the laser beam having been reflected by the first laser resonator mirror and having thus been entered into the laser beam source.

The converging optical system may contain a free space having a predetermined distance.

Furthermore, in the laser beam scanning radiating apparatus in accordance with the present invention, the laser beam source may radiate out the plurality of the laser beams from positions located in a skew lattice pattern in a two-dimensional plane normal to the optical axis, and the plurality of the Fourier transform lens optical systems, which constitute the Fourier transform lens array optical system, and phase modulating elements of the phase modulating means may be arrayed in the reciprocal lattice pattern in accordance with the skew lattice pattern of the laser beam radiating positions. In such cases, the plurality of the Fourier transform lens optical systems, which constitute the Fourier transform lens array optical system, can be arrayed more closely, and therefore the efficiency, with which the laser beams are combined with one another, can be kept high.

The term "locating in a skew lattice pattern" as used herein means that the laser beam radiating positions in the laser beam source are located in a skew periodic pattern at predetermined intervals in each of two directions on a predetermined skew coordinate system.

Specifically, in general, the laser beam radiating positions in the laser beam source may be located at points on a skew lattice given as the solutions of the simultaneous equations of Formulas (21) and (22) on an orthogonal x-y coordinate system.

$$a_1 x + b_1 y = n_1 \quad n_1 \text{: an integer} \tag{21}$$

$$a_2 x + b_2 y = n_2 \quad n_2 \text{: an integer} \tag{22}$$

where $$a_1 = \frac{\alpha}{d_1\sqrt{1+\alpha^2}}, b_1 = \frac{1}{d_1\sqrt{1+\alpha^2}}$$

$d_1$: the orthogonal distance between the skew lattice axes represented by Formula (21)

$\alpha$: the inclination of Formula (21) with respect to the x axis $$a_2 = 0, b_2 = -\frac{1}{d_2}$$

$d_2$: the orthogonal distance between the skew lattice axes represented by Formula (22)

The term "reciprocal lattice pattern in accordance with a skew lattice pattern" as used herein means the pattern of the points on the lattice given as the solutions of the simultaneous equations of Formulas (24) and (25) on an orthogonal $u_1$-$u_2$ coordinate system, which is obtained from Fourier transform of the orthogonal x-y coordinate system.

$$-\frac{b_1}{\Delta}\frac{u_1}{\lambda f_1} + \frac{a_1}{\Delta}\frac{u_2}{\lambda f_1} = J_1 \quad J_1\text{:an integer} \quad (24)$$

$$\frac{b_2}{\Delta}\frac{u_1}{\lambda f_1} - \frac{a_2}{\Delta}\frac{u_2}{\lambda f_1} = J_2 \quad J_2\text{:an integer} \quad (25)$$

$$\Delta = a_1 b_2 - a_2 b_1$$

With the laser beam scanning radiating apparatus in accordance with the present invention, the plurality of the laser beams, which have been radiated out of the laser beam source, have the predetermined angular spectra on the predetermined virtual plane, through which the laser beams intersecting one another pass. Therefore, interference fringes (far field patterns) due to the plurality of the laser beams are projected on the virtual plane.

The interference fringes are divided into small regions by the Fourier transform lens array optical system, which is located in a predetermined plane such that its Fourier transform plane may be close to the virtual plane. The small regions, into which the far field patterns have been divided, are respectively reproduced as the Fourier transformed patterns of the plurality of the laser beams on the Fourier transform plane of the Fourier transform lens array optical system by the respective lenses, which constitute the Fourier transform lens array optical system. The variation of the angular spectrum of each of the laser beams at the respective positions on the virtual plane, at which the plurality of the laser beams intersect one another, the focal length of the Fourier transform lens array optical system, the array pitch of the Fourier transform lens array optical system, the number of the plurality of the laser beams radiated out of the laser beam source, and the wavelength of the laser beams are set to be equal to predetermined values. Therefore, the plurality of the Fourier transformed patterns of the laser beams, which patterns are reproduced on the Fourier transform plane of the Fourier transform lens array optical system, stand in a line at a predetermined pitch as a whole.

The super modes, which can occur in the resonator structure of the laser beam scanning radiating apparatus in accordance with the present invention, are determined by the set of the amplitude and the phase of each laser beam, which propagates self-consistently in the resonator structure. The super modes are expressed as the solution vectors of the eigen equation representing the resonator, and the same number of eigen modes as that of the laser beam radiating positions in the laser beam source are present.

Of the power threshold gain values necessary for the oscillation in the eigen modes, which can occur in the resonator structure of the laser beam scanning radiating apparatus in accordance with the present invention, the power threshold gain value necessary for the oscillation in the eigen mode, in which each of the laser beams radiated out of the Fourier transform lens array optical system has the same phase with respect to a predetermined direction, is smallest. Therefore, the eigen mode, in which each of the laser beams radiated out of the Fourier transform lens array optical system has the same phase with respect to the predetermined direction, is formed in a self-organizing manner. At this time, the plurality of the laser beams radiated out of the Fourier transform lens array optical system form a single same wave front as a whole.

The array-like phase modulating means slightly advances or delays the phase of each of the Fourier transformed patterns of the plurality of the laser beams, which have been radiated out of the laser beam source and which have the same phase, such that the phases of adjacent Fourier transformed patterns may become slightly different from each other. In this manner, the array-like phase modulating means modulates the phases of the Fourier transformed patterns. The degree of the modulation is determined by the scanning drive means.

In the manner described above, the phase of each of the Fourier transformed patterns is slightly advanced or delayed. As a result, the mode, in which the laser beams are radiated with a predetermined phase inclination on the Fourier transform plane of the Fourier transform lens array optical system, is formed in the self-organizing manner such that the wave fronts of the laser beams, which have been radiated out of the Fourier transform lens array optical system, may have the same phase as a whole with respect to a direction, which is deviated from the optical axis by an angle corresponding to the advanced or delayed phase of each laser beam. Therefore, each of the laser beams travels to the direction, which is deviated from the optical axis by an angle corresponding to the advanced or delayed phase of each laser beam.

The direction, to which each of the laser beams travels, can be changed continuously and smoothly by the scanning drive means, which continuously changes the degree of phase modulation.

The laser beams, which have been radiated out of the Fourier transform lens array optical system to the directions of travel having been changed, impinge upon the first laser resonator mirror, which may be constituted of a semi-transparent mirror, or the like. The laser beams are reflected by the first laser resonator mirror reversely to the directions of incidence of the laser beams, travel reversely along their optical paths, and return to the laser beam source. The laser beams are then reflected by the second laser resonator mirror, which may be constituted of a reflecting mirror and is located at the position rearward from the laser beam source. When the gain exceeds the loss, the power of the laser beams is amplified while they are being repeatedly reflected between the two laser resonator mirrors. Thereafter, the resulting combined laser beam passes through the first laser resonator mirror, which may be constituted of a semi-transparent mirror, or the like, and is thus radiated out of the laser beam scanning radiating apparatus.

The same effects described above can be obtained regardless of the directions to which the laser beams travel. Therefore, the directions of travel of the laser beams with respect to the optical axis can be changed continuously by operating the phase modulating means by the scanning drive means. Accordingly, with the laser beam scanning radiating apparatus in accordance with the present invention, mechanical movable parts need not be used, and therefore the scanning stability and the scanning speed can be kept high.

Also, the scanning can be carried out in two-dimensional directions or in more directions by arraying the laser beam radiating positions in the laser beam source, the phase modulating elements of the phase modulating means, and the lenses constituting the Fourier transform lens array optical system in a two-dimensional pattern. Further, with such two-dimensional arrays, a larger number of laser beams can be combined with one another, and a combined laser beam having a higher intensity can be obtained. In such cases, each of the two-dimensional arrays can be formed into the closest structure.

BRIEF DESCRIPTION OF THE DRAWINGS

FIG. 1 is a schematic view showing an embodiment of the laser beam scanning radiating apparatus in accordance with the present invention, FIG. 13 is a schematic view showing an embodiment of the laser beam scanning radiating apparatus in accordance with the present invention, wherein an array laser 10" composed of laser beam sources located in a skew periodic pattern is used, FIG. 14 is a schematic view showing an embodiment of the laser beam scanning radiating apparatus in accordance with the present invention, wherein an array laser 10" composed of laser beam sources located in a pattern, which is periodic at least in a single direction, is used.

DESCRIPTION OF THE PREFERRED EMBODIMENTS

Figure 2:
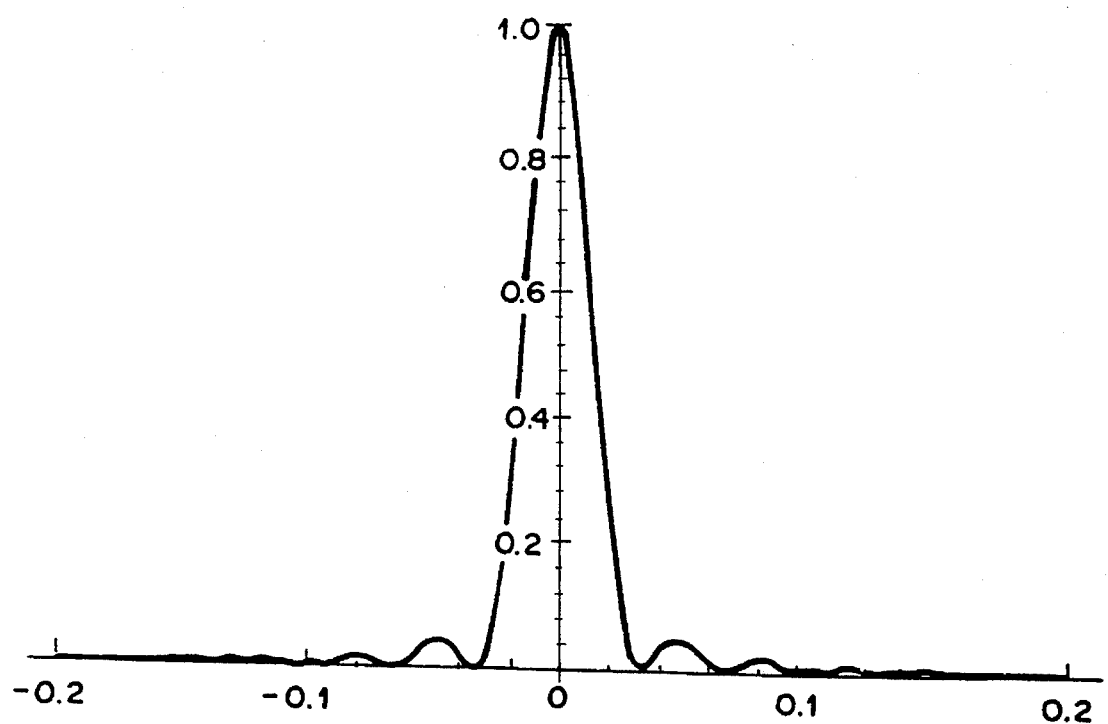
FIG. 2 is an intensity distribution diagram showing the intensity distribution of a combined laser beam radiated out of the embodiment of FIG. 1.

The present invention will hereinbelow be described in further detail with reference to the accompanying drawings.

The analyses described below are premised on assumptions (i), (ii), (iii), and (iv). (i) Each of the lasers constituting an array laser oscillates in a single longitudinal and transverse mode. (ii) Each of the lasers constituting the array laser produces an Airy beam. (iii) Laser beams produced by the lasers constituting the array laser are coupled with one another only by the coupling effects of a round trip in a resonator. (iv) Return light, which has been partially reflected by a resonator mirror, is distributed by a Fourier transform lens array optical system to the respective lasers, which constitute the array laser, such that no loss of radiant energy and no phase difference may occur.

FIG. 1 is a schematic view showing an embodiment of the laser beam scanning radiating apparatus in accordance with the present invention. With reference to FIG. 1, the laser beam scanning radiating apparatus comprises an array laser 10 composed of N number of laser beam sources 11, 11, . . . , which produce coherent laser beams Li having a wavelength λ and which are located in a two-dimensional pattern at a pitch $d_1$. The laser beam scanning radiating apparatus also comprises a Fourier transform lens 20, which has a focal length $f_1$ and is located so as to stand facing the array laser 10. The laser beam scanning radiating apparatus further comprises a Fourier transform lens array optical system 30, which is located on a Fourier transform plane SA of the Fourier transform lens 20 and which divides far field patterns of the array laser 10 into small regions. The Fourier transform lens array optical system 30 is composed of a beam expander array (an expander lens array) 31 and a Fourier transform lens array 33, which is composed of an array of a plurality of Fourier transform lenses 33i, 33i, . . . . The laser beam scanning radiating apparatus still further comprises a resonator mirror optical system 40, which is constituted of a converging lens 41 located so as to stand facing the Fourier transform lens array optical system 30, a first resonator mirror 42, and a second resonator mirror 50 located on the back surface side of the array laser 10 opposite to the laser beam radiating surface. The laser beam scanning radiating apparatus also comprises a phase modulating means 60, which comprises an array of phase modulating elements 61, 61, . . . and is located between the beam expander array 31 and the Fourier transform lens array 33 of the Fourier transform lens array optical system 30. The phase modulating means 60 modulates each of the phases of the laser beams having been divided into the small regions, such that the wave fronts of the plurality of the laser beams after having been subjected to the Fourier transform in the Fourier transform lens array optical system 30 may have the same phase with respect to a predetermined direction as a whole. The laser beam scanning radiating apparatus further comprises a scanning drive means 70, which drives the phase modulating means 60 such that the directions of travel of the laser beams L having been radiated out of the Fourier transform lens array optical system 30 may be changed with a desired period.

The array laser 10 and the Fourier transform lens 20 are located such that the laser beams Li, which have been radiated out of the laser beam sources 11, 11, . . . constituting the array laser 10, may intersect one another on the Fourier transform plane SA of the Fourier transform lens 20 so as to have an angular spectrum difference (i.e. a variation of an angular spectrum $\alpha_m$) $\Delta\alpha$ with respect to one another.

The Fourier transform lens array optical system 30 is located such that its front Fourier transform plane SB may coincide with the Fourier transform plane SA of the Fourier transform lens 20.

The number N of the laser beam sources 11, 11, . . . constituting the array laser 10, the lens pitch (the array pitch) p of the Fourier transform lens array optical system 30, the focal length $f_2$ of the Fourier transform lens array optical system 30, the wavelength $\lambda$ of the laser beam, and the angular spectrum difference $\Delta\alpha$ are set so as to satisfy the conditions of Formulas (1) and (2).

$$p\Delta\alpha = I \quad (1)$$

where I represents an integer other than 0.

$$\lambda \Delta\alpha f_2 N = p \quad (2)$$

As an aid in facilitating the explanation, an analysis is made on the assumption that the array laser 10, the Fourier transform lens array optical system 30, and the like, are located in a one-dimensional form in the plane of the sheet of FIG. 1. Formulas (1) and (2) can be modified into Formulas (3) and (4) and represent the conditions such that the near field patterns of the plurality of the laser beam sources can be reproduced at an equal interval as a whole on a back Fourier transform plane SC of the Fourier transform lens array optical system 30.

$$\frac{d_1 p}{\lambda f_1} = I \quad (3)$$

where $d_1$ represents the array pitch of the array laser 10, and $f_1$ represents the focal length of the Fourier transform lens 20.

$$\frac{f_2}{f_1} d_1 N = p \quad (4)$$

The radius of curvature of the reflecting surface of the first resonator mirror 42 is set to be equal to the radius of curvature of the wave front of the laser beam, which has been converged by the converging lens 41, at the position of the first resonator mirror 42. How the radius of curvature is set will be described later.

How this embodiment of the laser beam scanning radiating apparatus in accordance with the present invention operates will be described hereinbelow.

The laser beams Li, which have been radiated out of the laser beam sources 11, 11, . . . constituting the array laser 10, are caused by the Fourier transform lens 20 to intersect one another and are superposed one upon another such that they have a predetermined angle difference ($\lambda \cdot \Delta\alpha$) with respect to one another on the Fourier transform plane SA of the Fourier transform lens 20. Far field patterns of the array laser 10 are thus formed on the Fourier transform plane SA. The amplitude distribution $\psi_1(u)$ of the far field patterns of the array laser 10 at a distance u from the optical axis on the Fourier transform plane SA constitutes an interference pattern resulting from the superposition of the amplitude distributions of the radiated laser beams having a central angular spectrum am and is represented by Formula (5).

$$\Psi_1(u) = \sum_{m=1}^{N} A_m \exp(i\phi_m)\exp(-2\pi i\alpha_m u) \quad (5)$$

where $A_m$: the amplitude of each laser beam Li $\phi_m$: the phase of each laser beam Li $$\alpha_m = \frac{d_1}{\lambda f_1} \left( m - \left( \frac{N+1}{2} \right) \right)$$

: the central angular spectrum of each laser beam

The interference pattern of the amplitude distribution $\psi_1(u)$ represented by Formula (5) is divided by the Fourier transform lens array optical system 30 into a plurality of small regions corresponding to the array number of the Fourier transform lens array optical system 30, which comprise the beam expander array 31 and the Fourier transform lenses 33i, 33i, . . . . . Also, near field patterns of the array laser 10 are reproduced for the respective small regions on the back Fourier transform plane SC of the Fourier transform lens array optical system 30. The amplitude distribution $\psi_2(w)$ of the reproduced near field patterns of the array laser 10 at a distance w from the optical axis on the back Fourier transform plane SC (i.e. the optical axis of the entire Fourier transform lens array optical system 30, and not the optical axis of each of the Fourier transform lens optical systems constituting the Fourier transform lens array optical system 30) is represented by Formula (6).

$$\Psi_2(w) = c \sum_{l=-L}^{L} \sum_{m=1}^{N} A_m \exp\{i\phi_m - 2\pi i\alpha_m (lp+\delta)\} \cdot \operatorname{sinc}\left\{ \frac{c}{\lambda f_2} (w + \lambda f_2 \alpha_m - lp - \delta) \right\} \quad (6)$$

where

2L+1: the array number of the Fourier transform lens array optical system $\delta$: the amount of shift of the Fourier transform lens array optical system with respect to the array laser $c=\eta p$: the equivalent aperture diameter of the phase modulating elements 61, 61, . . .

η: the efficiency of the equivalent aperture diameter with respect to the lens diameter of the Fourier transform lens array optical system Formula (3) indicates that the array pitch p of the Fourier transform lens array optical system 30 coincides with integral multiples of the pitch of the interference fringes of the array laser 10 projected onto the Fourier transform plane SA of the Fourier transform lens 20. By the substitution of Formula (3) into Formula (6) and setting the amount of shift as δ=0, the amplitude distribution $\psi_2(w)$ of the array laser 10 can be modified into Formula (7).

$$\Psi_2(w) = c \sum_{l=-L}^{L} \sum_{m=1}^{N} A_m \exp(i\phi_m)\exp\{i\pi\, lI(N+1)\} \cdot \operatorname{sinc}\left\{ \frac{c}{\lambda f_2}(w + \lambda f_2 \alpha_m - lp) \right\} \quad (7)$$

According to Formula (7), in cases where the number N of the laser beam sources of the array laser 10 is odd or in cases where I in Formula (1) or in Formula (3) is even, the oscillation phase and the intensity 10 represented by the near field patterns of the array laser reproduced on the back Fourier transform plane SC of the Fourier transform lens array optical system 30 are kept the same as the oscillation phase and the intensity occurring at the time of radiation from the array laser 10. In cases where the number N of the laser beam sources of the array laser 10 is even and I in Formula (1) or in Formula (3) is odd, the phase is inverted alternately with respect to the array pitch p of the Fourier transform lens array optical system 30. In cases where the phase is thus inverted, the phase difference of p occurring in accordance with the array pitch p of the Fourier transform lens array optical system 30 can be compensated for by modulating the phase by an extent of π with the phase modulating means 60. In this manner, the amplitude distribution of the array laser 10, in which the oscillation phase is kept unchanged, can be reproduced on the back Fourier transform plane SC of the Fourier transform lens array optical system 30.

The pitch $d_2$ of the patterns of the array laser 10 reproduced on the back Fourier transform plane SC of the Fourier transform lens array optical system 30 in the manner described above, the beam diameter D of the array laser 10, the fill factor (i.e. the ratio of the beam diameter D to the pitch $d_2$ of the patterns of the array laser 10) F are respectively represented by Formulas (8), (9), and (10).

$$d_2 = \lambda f_2 \Delta\alpha = \frac{f_2}{f_1} d_1 \quad (8)$$

$$D = \frac{1.64 \lambda f_2}{C} \quad (9)$$

$$F = \frac{D}{d_2} = \frac{1.64}{c\Delta\alpha} = \frac{1.64}{\eta I} \quad (10)$$

According to Formula (10), the fill factor F takes a maximum value when I=1. At this time, the fill factor F is in inverse proportion to the efficiency η. Therefore, the fill factor F can be rendered large by making the efficiency η small.

This embodiment of the laser beam scanning radiating apparatus is set such that it may satisfy Formula (2) or Formula (4). Therefore, the distance between the near field patterns of the array laser 10 reproduced by the Fourier transform lens optical systems, which are adjacent to each other among the plurality of the Fourier transform lens array optical systems constituting the Fourier transform lens array optical system 30, becomes equal to $d_2$. The near field patterns of the array laser 10 are projected at an equal pitch as a whole on the back Fourier transform plane SC of the Fourier transform lens array optical system 30.

Figure 15:
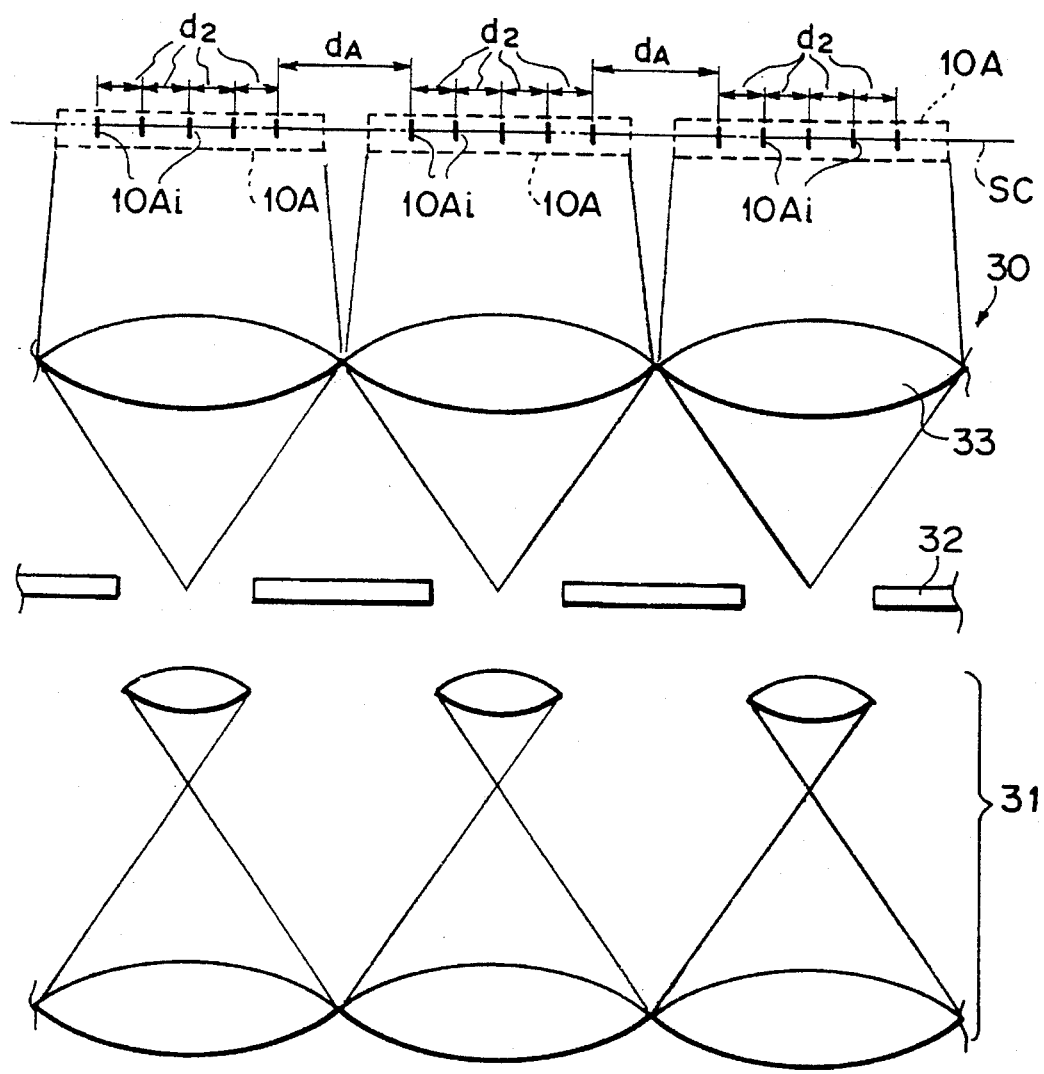
FIG. 15 is an explanatory view showing how the reproduced near field patterns of the array laser are arrayed at an equal pitch as a whole.

How the near field patterns of the array laser 10 reproduced on the back Fourier transform plane SC of the Fourier transform lens array optical system 30 stand in a line at an equal pitch as a whole will be described in detail hereinbelow with reference to FIG. 15. As illustrated in FIG. 15, near field patterns 10A, 10A, . . . of the array laser 10 are reproduced by the plurality of the Fourier transform lens optical systems constituting the Fourier transform lens array optical system 30. Each of the near field patterns 10A, 10A, . . . has peaks 10Ai, 10Ai, . . . at predetermined intervals $d_2$. The positions, at which the peaks 10Ai, 10Ai, . . . are located, correspond to the pitch $d_1$ of the plurality of the laser beam sources 11, 11, . . . constituting the array laser 10. When the two near field patterns 10A, 10A of the array laser 10 reproduced by two adjacent Fourier transform lens optical systems are considered, in cases where Formula (2) or Formula (4) is satisfied, the distance $d_A$ between the two peaks 10Ai, 10Ai of the two near field patterns 10A, 10A, which peaks are adjacent to each other, becomes equal to the pitch $d_2$ of the peaks 10Ai, 10Ai, . . . of the near field pattern 10A of the array laser 10 reproduced by a single Fourier transform lens optical system. In cases where all of the distances between adjacent peaks 10Ai, 10Ai of the near field patterns 10A, 10A, . . . of the array laser 10 reproduced on the back Fourier transform plane SC are equal, it is regarded that the near field patterns of the array laser 10 stand in a line at an equal pitch as a whole.

At this time, Formula (7) can be modified into Formula (11). It is presumed that, in cases where the number N of the laser beam sources of the array laser 10 is even and I in Formula (1) or in Formula (3) is odd, the phase distribution inverted alternately with respect to the array pitch p of the Fourier transform lens array optical system 30 is corrected by the phase modulating means 60.

$$\Psi_2(w) = c \sum_{l=-L}^{L} \sum_{m=1}^{N} A_m \exp(i\phi_m)\operatorname{sinc}\left\{ \frac{c}{\lambda f_2}(w + pg) \right\} \quad (11)$$

where $$g = \frac{1}{N}\left(m - \frac{N+1}{2}\right) - l$$

The amplitude distribution $\psi_3(f_w)$ of the array laser 10 at the far field of the Fourier transform lens array optical system 30 can be obtained by carrying out Fourier transform of Formula (11) and is thus represented by Formula (12).

$$\Psi_3(f_w) = \lambda f_2 \operatorname{rect}\left(\frac{\lambda f_2 f_w}{c}\right) \quad (12)$$

$$\sum_{l=-L}^{L} \sum_{m=1}^{N} A_m \exp(i\phi_m)\exp(2\pi i\, p\, g f_w)$$

where $$f_w = \frac{\tan\theta}{\lambda}$$

θ: angle of far field

A more concrete constitution will be described hereinbelow. First, parameters of respective components are set as follows:

Number N of the laser beam sources 11, 11, . . . constituting the array laser 10 =9

Pitch $d_1$ between adjacent laser beam sources 11, 11 of the array laser 10=125 μm Wavelength λ of the laser beam=781.25 nm Focal length $f_1$ of the Fourier transform lens 20=8 mm

I=1, η=1

Array number M of the Fourier transform lens array optical system 30=21

These values are substituted into Formulas (1), (2), (8), (9), and (10), and the values of the other parameters are set as follows:

Array pitch p of the Fourier transform lens array optical system 30=50 μm

Focal length $f_2$ of the Fourier transform lens array optical system 30=355.6 μm Pitch $d_2$ of the array laser 10 reproduced on the back Fourier transform plane SC of the Fourier transform lens array optical system 30=5.6 μm Beam diameter D of the array laser 10 reproduced on the back Fourier transform plane SC of the Fourier transform lens array optical system 30=9.1 μm Fill factor F=1.64

FIG. 2 shows the results of the intensity distribution of the laser beam, which is radiated out of the laser beam scanning radiating apparatus wherein the parameters of the respective components are set at the values described above, with respect to the angle of far field θ.

From FIG. 2, it has been confirmed that this embodiment of the laser beam scanning radiating apparatus radiates out the laser beam having the intensity distribution, which is sufficiently single-lobed.

An analysis will be made hereinbelow with respect to the oscillation eigen mode of this embodiment of the laser beam scanning radiating apparatus.

The super modes, which can occur in the resonator structure of this laser beam scanning radiating apparatus, are determined by the set of the amplitude and the phase of each laser beam, which propagates self-consistently in the resonator structure. The super modes are expressed as the solution vectors of the eigen equation of Formula (13), and N number of modes are present.

$$[r_o r \exp(i\, 2\sigma L)\, R_r - I] e = 0 \quad (13)$$

where $R_r$ represents the reflection matrix in the resonator structure, e represents the eigen vector, $r_o$ represents the amplitude reflectance of the back end face of the laser, r represents the amplitude reflectance of the radiating mirror, and σ represents the complex propagation constant of the super mode.

From Formula (13), the value of $(r_o \cdot r)^{-1} \exp(-i2\sigma L)$ is the eigen value λv of $R_r$, and the super mode of the resonator structure is the eigen vector of the matrix $R_r$. Therefore, the power threshold gain gn of the super mode of this resonator structure is given by Formula (14) from the eigen value λv.

$$(r_o\, r)^{-1} \exp(-i2\sigma L) = \lambda v \quad (14)$$

$$\sigma v = \frac{n\omega v}{c} - \frac{ig v}{2}$$

$$\therefore g v = \frac{1}{L} \ln\left(\frac{1}{r_o r}\right) + \frac{1}{L} \ln\left(\frac{1}{|\lambda v|}\right)$$

Also, the reflection matrix represents the coupling coefficient between the respective laser beams, which are radiated out of the laser beam sources 11, 11, . . . constituting the array laser 10, due to the effects of the round trip in the resonator. Specifically, due to the effects of the round trip in the resonator structure, each of the laser beams, which are respectively radiated out of the laser beam sources 11, 11, . . . constituting the array laser 10, is reflected to the opposite side with respect to the optical axis and coupled with the laser beam located at the position, to which the laser beam is reflected. Further, the laser beam, which has been reflected by the first resonator mirror 42, is not converged to the back Fourier transform plane SC and is diverged due to the diffraction effects. The laser beam, which has been reflected by the first resonator mirror 42, is thus coupled with the other laser beam, which is present in the vicinity.

Figure 3:
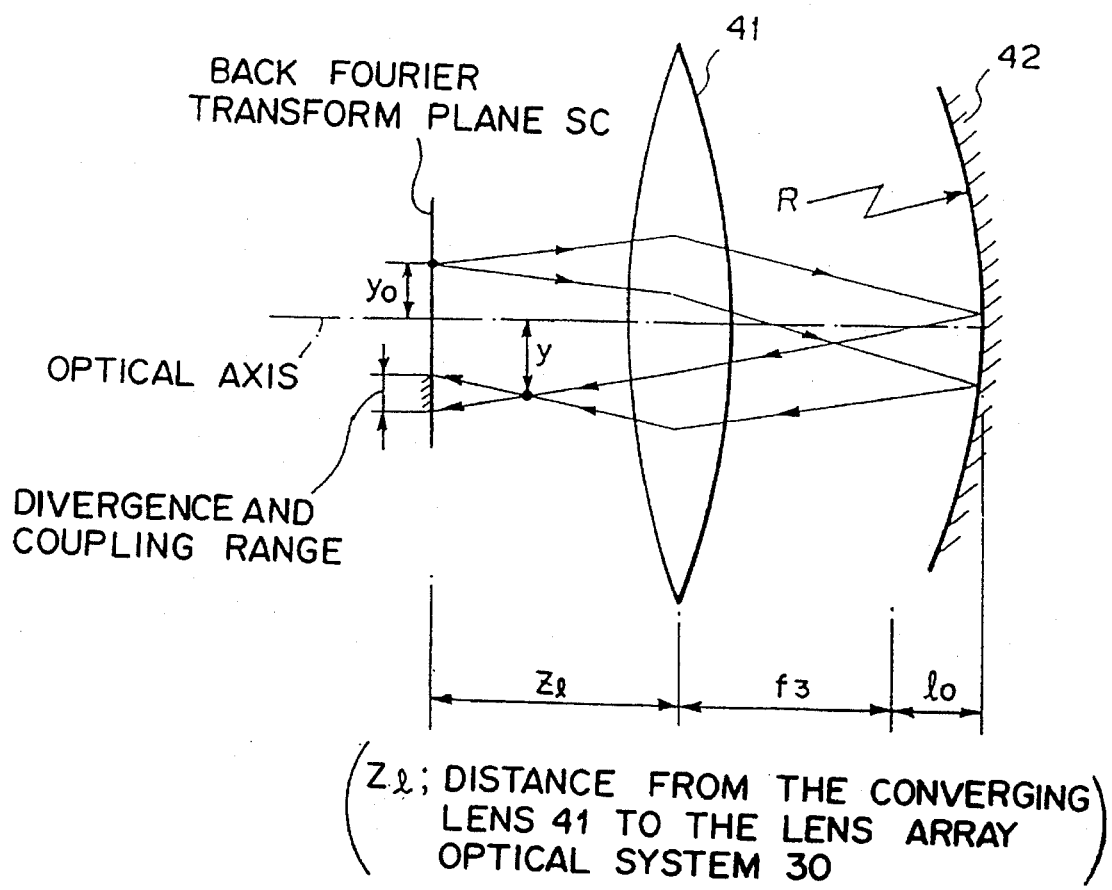
FIG. 3 is an explanatory diagram showing the optical paths of laser beams having been radiated out of secondary array laser beam sources.

As an aid in facilitating the explanation, the near field patterns of the array laser 10, which are reproduced on the back Fourier transform plane SC of the Fourier transform lens array optical system 30, may be regarded as secondary array laser beam sources. In such cases, coupling between the laser beams, which are radiated out of the laser beam sources 11, 11, . . . constituting the array laser 10, is identical with the coupling between the laser beams, which come from the secondary array laser beam sources, due to reflection by the resonator mirror optical system 40. As illustrated in FIG. 3, in cases where the laser beam coming from the secondary array laser beam source on the back Fourier transform plane SC, which source is located at a distance $y_0$ from the optical axis, is reflected from the first resonator mirror 42 and converged on the back Fourier transform plane SC, the distance y from the optical axis to the position, at which the laser beam is converged, can be calculated with Formula (15). (The position, at which the laser beam is converged, has been detected with paraxial ray tracing by assuming that the beam diameter of each laser beam is sufficiently small.)

$$y = -\frac{y_0}{f_3}\left[ f_3 + 2l_0^2 \left\{ \frac{1}{R} + \left(\frac{f_3}{Z_d}\right)^2 \left(\frac{1}{f_3} + \frac{1}{R}\right) \right\} \right] \quad (15)$$

where $$Z_d = \frac{4\lambda f_3^2}{\pi B^2}$$

B: the diameter of the laser beam radiated out of the Fourier transform lens array optical system 30 (=P·M)

$f_3$: the focal length of the converging lens 41

$l_0$: the distance from the focal point of the converging lens 41 to the first resonator mirror 42

R: the radius of curvature of the first resonator mirror 42

Arranging Formula (15) yields $y = -y_0$. This indicates that the laser beam is reflected to the position symmetric with respect to the optical axis and is coupled with the other laser beam. Therefore, in cases where the array laser 10 and the Fourier transform lens array optical system 30 are located in a one-dimensional pattern and Formula (1) is satisfied, by the synergistic effects of the coupling and the beam divergence due to the diffraction, the respective elements $\{r_{ij}\}$ of the reflection matrix $R_r$ representing the coupling coefficient can be represented by Formula (16).

$$r_{ij} = -\frac{\eta}{(2L+1)} \cdot \exp(2ikD)\, Rect\left[\frac{1}{\eta N}\left(i - \frac{N+1}{2}\right)\right]\cdot \quad (16)$$

$$\sum_{l1=-L}^{L} \sum_{l2=-L}^{L} \exp\{i(\phi_{l1} + \phi_{l2})\} \exp\left[-2\pi i \frac{pd_1}{\lambda f_1}\left(i - \right.\right.$$

$$\left.\left.\frac{N+1}{2}\right) l_2 \right] \cdot \int_{-\infty}^{\infty} Rect(x) \exp\left\{-\pi i \eta^2 \lambda z \left(\frac{p}{\lambda f_2}\right)^2 x^2\right\}\cdot$$

$$\exp[-2\pi i \eta I\{(i+j-1) - N(l1+l2+1)\} x]\, dx$$

where

D: the resonator length z: the distance between the position of the secondary array laser beam source, which is formed on the back Fourier transform plane SC of the Fourier transform lens array optical system 30, and the position, at which the laser beam from the secondary array laser beam source is reflected and caused to form an image by the resonator mirror optical system 40

$\phi_{11}$, $\phi_{12}$: the phase modulation distribution given by the phase modulating means 60

In cases where the distance z between the position of the secondary array laser beam source, which is formed on the back Fourier transform plane SC of the Fourier transform lens array optical system 30, and the position, at which the laser beam from the secondary array laser beam source is reflected and caused to form an image by the resonator mirror optical system 40, is set to be large, the laser beams Li radiated out of the array laser 10 can be coupled with one another in parallel and uniformly.

Figure 4:
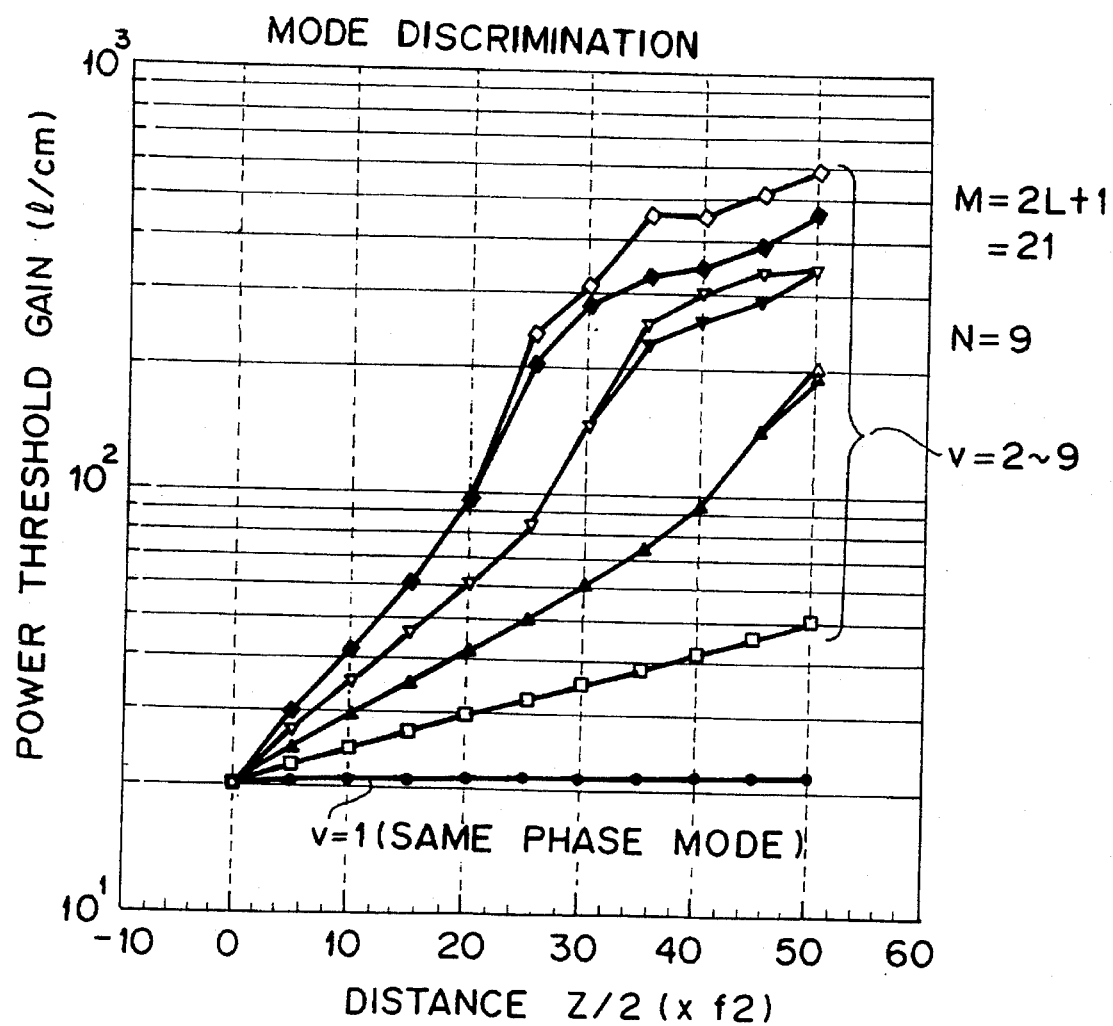
FIG. 4 is a graph showing the results of calculations of power threshold gain values (wherein N=9)

FIG. 4 shows the results of calculations of power threshold gain values with the eigen equation of Formula (13) (wherein N=9) in cases where no phase modulation is carried out. From FIG. 4, it has been confirmed that the power threshold gain values of the eigen mode ($\nu=1$), in which the respective laser beams Li are radiated with the same phase out of the array laser 10, are smallest, the differences between the power threshold gain values of the eigen mode ($\nu=1$) and the power threshold gain values of the other eigen modes ($\nu=2$ to 9) become sufficiently large as the distance z becomes large, and therefore the discrimination of the eigen mode, in which the respective laser beams Li are radiated with the same phase out of the array laser 10, can be kept good.

As described above, with this embodiment of the laser beam scanning radiating apparatus, the laser beams produced by the array laser can be coherently combined with one another and radiated out by the Fourier transform lens array optical system 30 and the resonator mirror optical system 40. Also, in cases where the parameters of the respective components are set so as to satisfy Formulas (1) and (2) [or Formulas (3) and (4)], and the distance z between the position of the secondary array laser beam source, which is formed on the back Fourier transform plane SC of the Fourier transform lens array optical system 30, and the position, at which the laser beam from the secondary array laser beam source is reflected and caused to form an image by the resonator mirror optical system 40, is set to be large, the respective laser beams can be uniformly coupled with one another. Further, in cases where I in Formula (1) or in Formula (3) is set to be 1, a combined laser beam, which has an intensity distribution with good single-lobed characteristics as illustrated in FIG. 2, can be radiated out of the first resonator mirror 42, and a laser beam having a high output power can be obtained easily.

Figure 5:
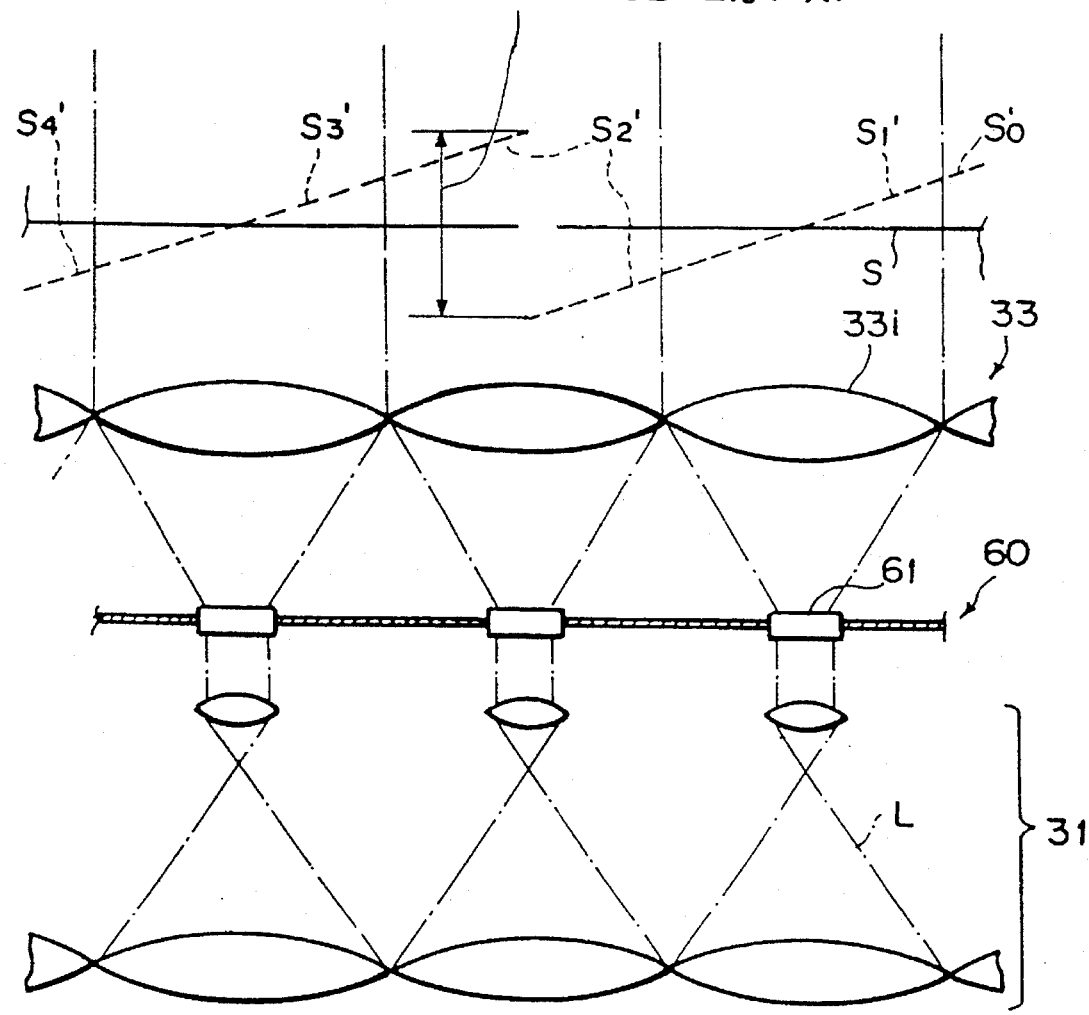
FIG. 5 is an explanatory view showing the wave fronts S, S' of laser beams after having passed through a Fourier transform lens array optical system 30 and a phase modulating means 60 in the embodiment of FIG. 1.

FIG. 5 is an explanatory view showing the wave fronts S, S' of laser beams after having passed through the Fourier transform lens array optical system 30 and the phase modulating means 60 in the embodiment of FIG. 1. In cases where the number N of the laser beam sources 11, 11, ... constituting the array laser 10 is odd or in cases where the value of I in Formula (1) is even, if the phase modulation by the phase modulating elements 61, 61, ... is not carried out, as indicated by the solid line, the wave fronts S of the laser beams L will form a single wave front, which is approximately normal to the optical axis and which is normal to the optical axis direction as a whole. This is because the number N of the laser beam sources 11, 11, ... constituting the array laser 10, the pitch $d_1$ of the array laser 10, the focal length $f_1$ of the Fourier transform lens 20, the lens pitch p of the Fourier transform lens array optical system 30, the focal length $f_2$ of the Fourier transform lens array optical system 30, and the wavelength $\lambda$ of the laser beam are set so as to satisfy the conditions of Formulas (1) and (2) [or Formulas (3) and (4)], and the mode, in which the respective laser beams Li are radiated with the same phase, is formed in the array laser 10 in the self-organizing manner.

When the phase modulating means 60 is driven by the scanning drive means 70 and each of the phases of the laser beams having been divided into the small regions is modulated in accordance with the predetermined phase inclination, the mode is formed in the self-organizing manner, in which the laser beams are radiated with the wave fronts S' ($=S_1'$, $S_2'$, $S_3'$, $S_4'$, ...) having predetermined inclinations, which are indicated by the broken lines in FIG. 5 in the respective Small regions corresponding to the respective lenses $33i$, $33i$, ..., such that the wave fronts of the laser beams radiated out of the Fourier transform lens array optical system 30 may have the same phase as a whole with respect to the direction, which is inclined with respect to the optical axis by an angle corresponding to the phase modulation.

In cases where N is even and I is odd, as described above, the phase modulating means 60 may be driven by the scanning drive means 70 so as to compensate for the phase distribution inverted alternately for the respective small regions.

By the effects described above, the laser beams L having been radiated out of the Fourier transform lens array optical system 30 impinge upon the converging lens 41 and are converged by the converging lens 41. Thereafter, the laser beams L impinge upon the first resonator mirror 42.

Figure 6:
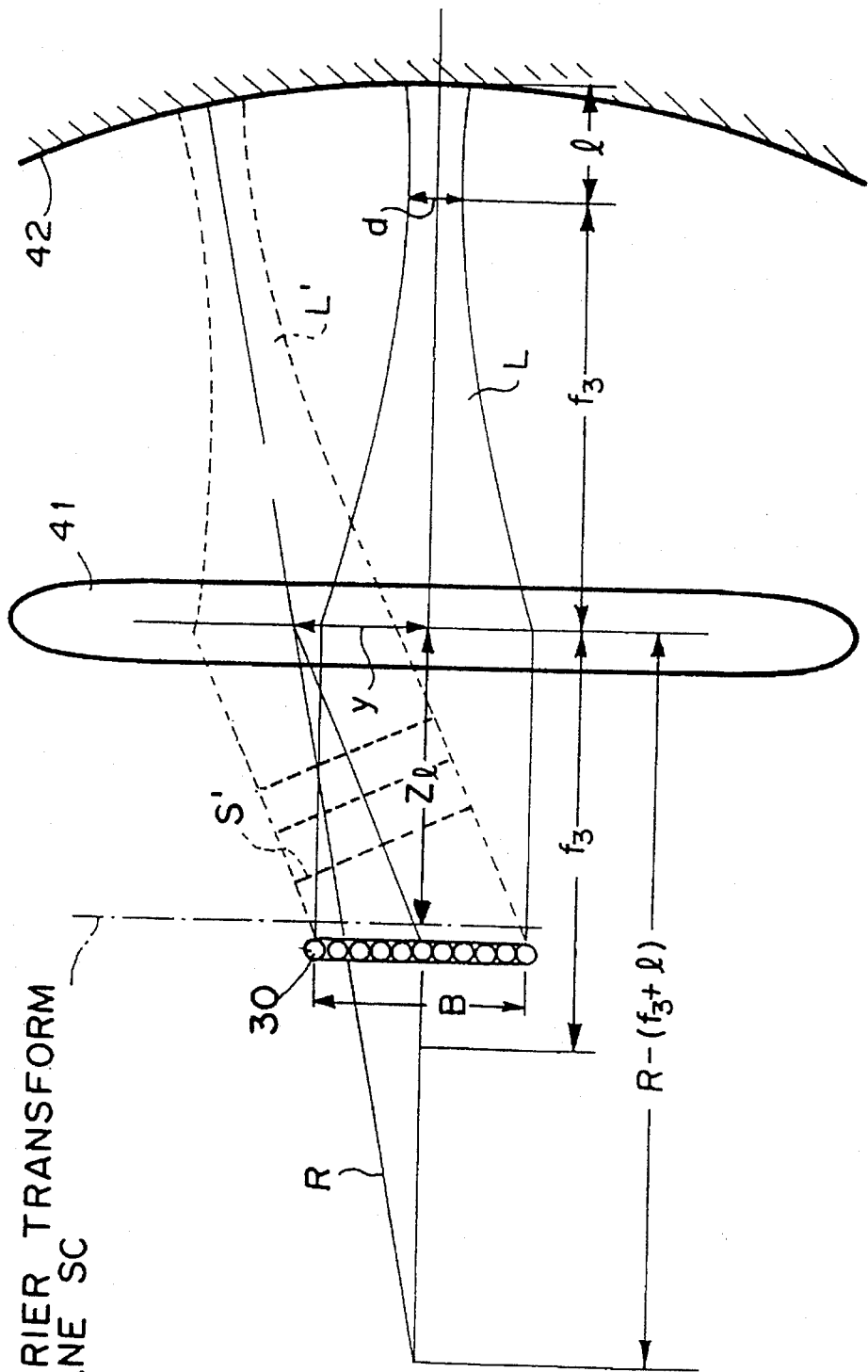
FIG. 6 is an explanatory view showing how the radius of curvature of a first resonator mirror 42 is set.

FIG. 6 is an explanatory view showing how the laser beams L are converged and how the radius of curvature of the first resonator mirror 42 is set. The laser beams L having been radiated out of the Fourier transform lens array optical system 30 can be regarded as Gaussian beams. The beam waist diameter d at the position of the focal length $f_3$ of the converging lens 41 can be represented by Formula (17).

$$d = \frac{B|f_3|}{\sqrt{(z_1 - f_3)^2 + z_B^2}} \tag{17}$$

where

B: the beam diameter of the laser beams L at the Fourier transform plane of the Fourier transform lens array optical system 30

$$z_B = \frac{\pi B^2}{4\lambda}$$

$z_1$: the distance between the back Fourier transform plane SC of the Fourier transform lens array optical system 30 and the converging lens 41

The value of $|z_1 - f_3|$ is markedly smaller than the value of $z_B$ (i.e., $|z_1 - f_3| \ll z_B$). Therefore, Formula (17) can be arranged into Formula (18).

$$d = \frac{B|f_3|}{z_B} \tag{18}$$

Therefore, the radius of curvature R of the wave fronts of the laser beams L at the distance 1 from the focal length $f_3$ of the converging lens 41 can be represented by Formula (19).

$$R = 1 + \frac{z_d^2}{1} \tag{19}$$

-continued where $$z_d = \frac{\pi d^2}{4\lambda}$$

In order for the first resonator mirror 42 to reflect the incident laser beams always reversely to the direction of incidence of the laser beams, the distance $z_1$ from the converging lens 41 to the back Fourier transform plane SC of the Fourier transform lens array optical system 30 should be set so as to satisfy Formula (20) such that the laser beams having been refracted by the converging lens 41 may impinge along the directions normal to the first resonator mirror 42, which has the radius of curvature equal to the radius of curvature R of the wave fronts of the incident laser beams.

$$z_1 \approx f_3 - \frac{f_3}{(R-1)} \qquad (20)$$

where

1: the distance from the focal length $f_3$ of the converging lens 41 to the first resonator mirror 42

The laser beams L, which have been reflected by the first resonator mirror 42 reversely to the direction of incidence, are resonated between the first resonator mirror 42 and the second resonator mirror 50. When the gain exceeds the loss, the power of the combined laser beam is amplified. In this manner, part of the coherently combined laser beam passes through the semi-transparent surface of the first resonator mirror 42 and is thus radiated out of the laser beam scanning radiating apparatus.

A signal for a desired scanning pattern is fed from the scanning drive means 70 into the phase modulating means 60. In this manner, the phases of the laser beams can be modulated, the inclinations of the wave fronts of the laser beams with respect to the optical axis can be changed, and the laser beams can thereby be scanned along a desired direction.

As described above, with this embodiment of the laser beam scanning radiating apparatus in accordance with the present invention, the laser beam having an intensity distribution having good single-lobed characteristics as shown in FIG. 2 can be scanned in one-dimensional direction or in two-dimensional directions.

Even if the value of the left side of Formula (1) is not equal to an integer of 1, in cases where the value is set to be equal to a value falling within the range of larger than 0 to smaller than 2, a combined laser beam having good single-lobed characteristics can be obtained by carrying out the predetermined phase modulation with the phase modulating means 60.

Figure 7A:
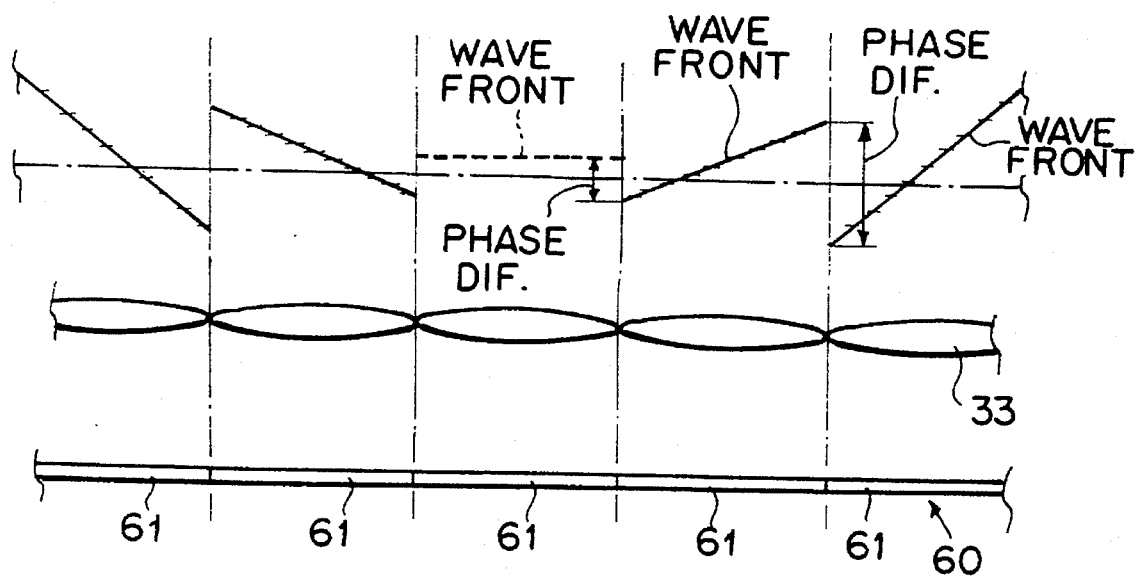
FIG. 7A is an explanatory view showing the state of wave fronts of laser beams, which have not been subjected to phase modulation and have passed through the Fourier transform lens array optical system 30.
Figure 7B:
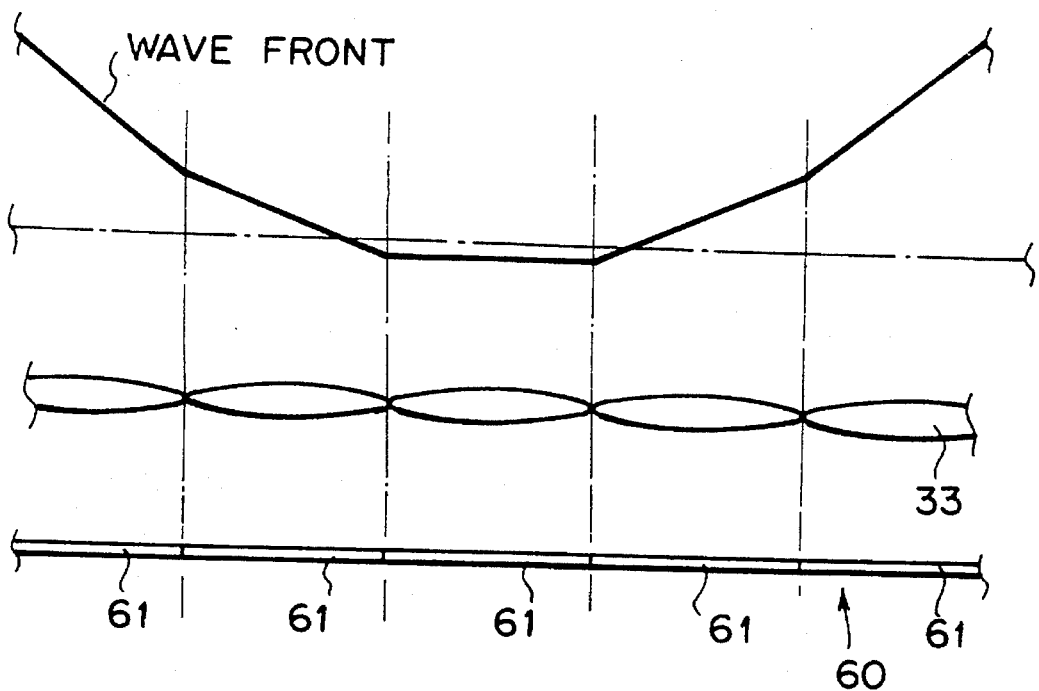
FIG. 7B is an explanatory view showing the state of wave fronts of laser beams, which have been subjected to phase modulation and have passed through the Fourier transform lens array optical system 30.

The term "predetermined phase modulation" as used herein means that the phases are modulated by driving the phase modulating elements 61, 61, . . . such that, as illustrated in FIG. 7B, the wave fronts of the laser beams after having passed through the Fourier transform lens array 33 may be smoothly connected with one another as a whole.

The first resonator mirror 42 need not necessarily reflect the incident laser beams reversely to the direction of incidence of the laser beams.

Figure 8:
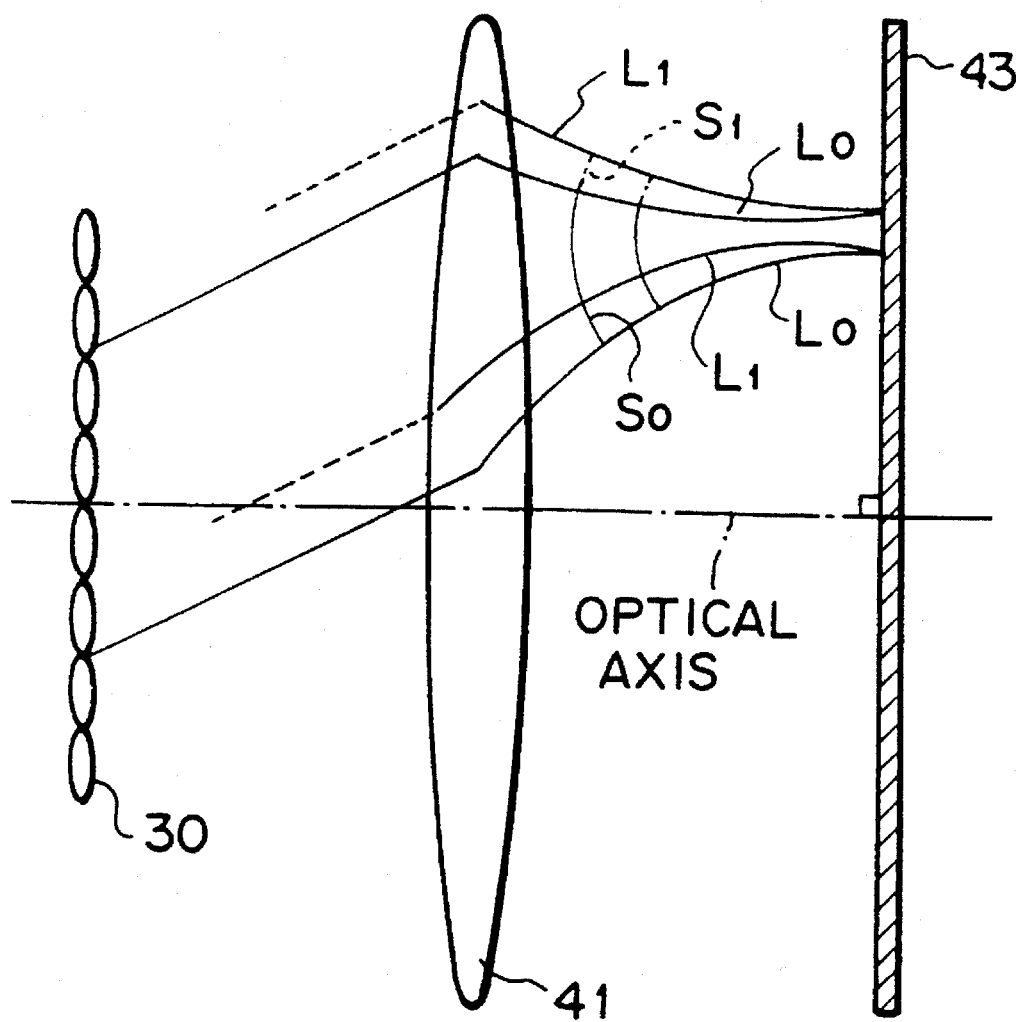
FIG. 8 is a schematic view showing the major part of an embodiment of the laser beam scanning radiating apparatus in accordance with the present invention, wherein a plane mirror is located at an angle with respect to a beam waist.

Specifically, for example, as illustrated in FIG. 8, the wave fronts $S_0$ of the laser beams $L_0$, which have the arranged phase distribution and have been radiated out of the converging lens 41, coincides with the wave fronts $S_1$ of the reflected beams $L_1$, which have been reflected at the beam waist of the laser beams $L_0$. Therefore, a plane-like resonator mirror 43 may be located perpendicularly to the optical axis at the beam waist of the laser beams, which have been converged by the converging lens 41 having been compensated for the field curvature. With such an embodiment, the wave fronts of the reflected laser beams overlap upon the wave fronts of the incident laser beams within a predetermined range of scanning angles. Therefore, with this embodiment, a coherently combined laser beam can be obtained.

Accordingly, the first resonator mirror is not limited to the mirror, which reflects the incident laser beams reversely to the direction of incidence of the laser beams.

Figure 9:
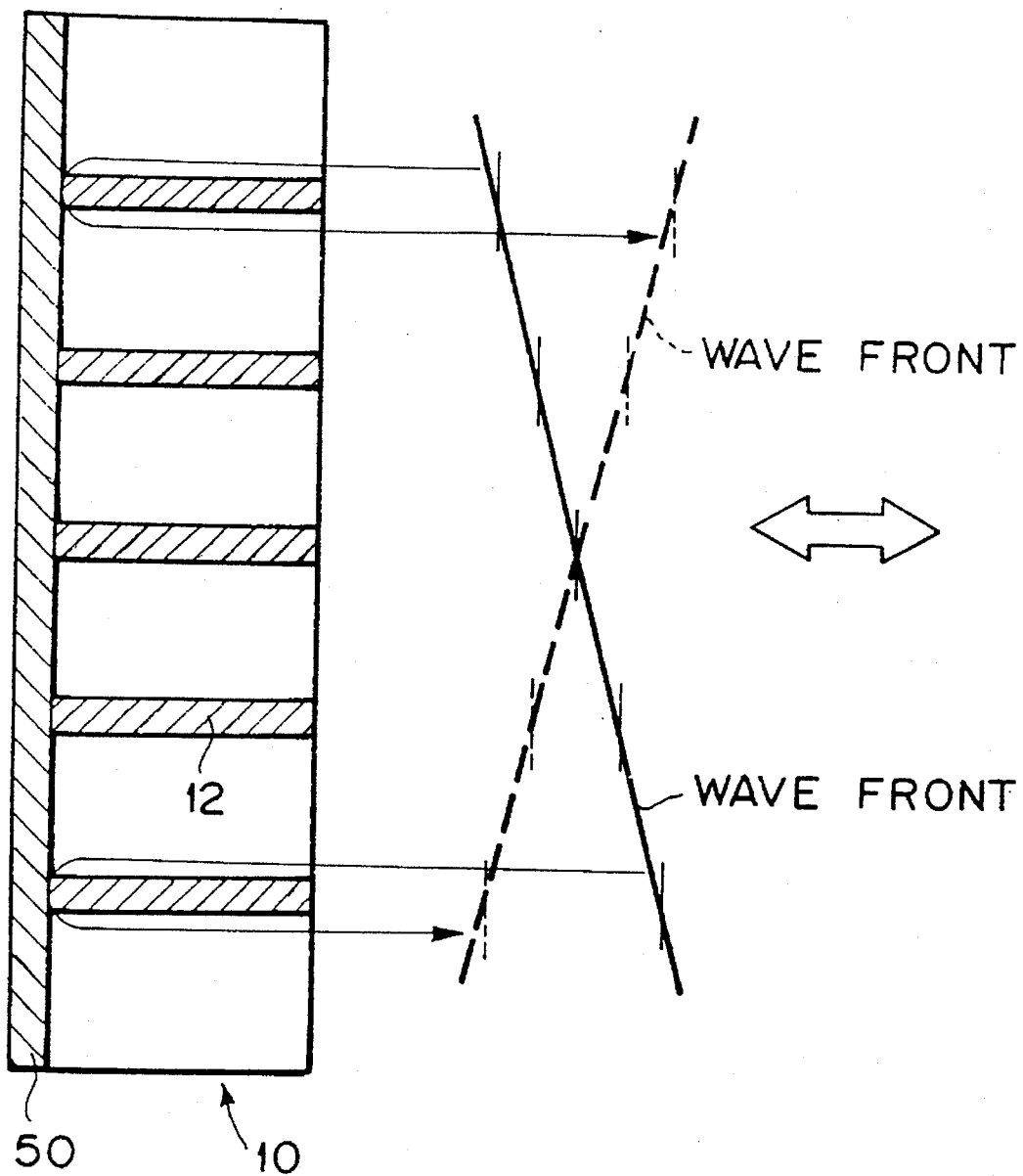
FIG. 9 is an explanatory view showing how a laser beam having a wave front (phase distribution) inclined with respect to the optical axis is reflected and how the wave front changes due to a round trip.

The laser beams radiated out of the array laser 10 may have the wave fronts as indicated by the solid line in FIG. 9, and the phase modulation may be carried out with the scanning drive means 70 and the phase modulating elements 61, 61, . . . such that the wave fronts of the laser beams radiated out of the Fourier transform lens array optical system 30 may have the same phase with respect to the direction, which is inclined by a corresponding angle with respect to the optical axis. In such cases, the optical system extending from the first resonator mirror 42 to the Fourier transform lens 20 becomes a reversible optical system with respect to the wave fronts of the laser beams. Therefore, the wave fronts of the reflected laser beams, which have been reflected by the first resonator mirror 42 and have again arrived at the radiating end face of the array laser 10, become identical with the wave fronts of the laser beams radiated out of the array laser 10. However, when the reflected laser beams impinge upon the radiating end face of the array laser 10, are then reflected by the second resonator mirror 50, and again arrive at the radiating end face of the array laser 10, the wave fronts of the laser beams, which are again radiated out of the radiating end face of the array laser 10 have the distribution, which is symmetric with respect to the optical axis as indicated by the broken line in FIG. 9. Therefore, when the laser beams make a round trip in the resonator, the original phase distribution of the wave fronts cannot be obtained, and the beam combining operation with the same phase cannot be carried out. Actually, a waveguide 12 has a finite width. Therefore, optical paths advancing in different directions through the waveguide 12 are present, and amplification of the laser beam is carried out by the effects, in which the component having the same phase with the original laser beam is coupled with the original laser beam. However, the efficiency of such amplification is not very high, and therefore a high amplification efficiency cannot be obtained.

Therefore, such that a high amplification efficiency can be obtained, the wave front of the laser beam having made a round trip should preferably be caused to coincide with the wave front of the original radiated laser beam by changing the inclination of the wave front of the laser beam, which has been reflected by the first resonator mirror 42, has passed through the converging lens 41, and has then impinged upon the array laser 10, with respect to the optical axis.

Figure 10A:
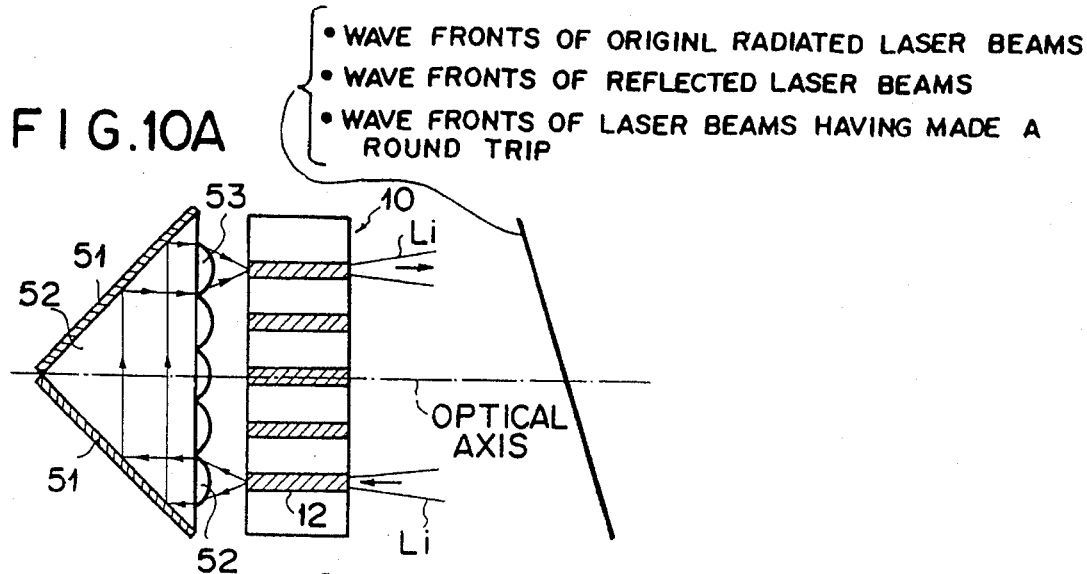
FIG. 10A is a schematic view showing an embodiment of the laser beam scanning radiating apparatus in accordance with the present invention, wherein the change in the phase distribution due to a round trip is compensated for by using a collimator lenses and a prism.
Figure 10B:
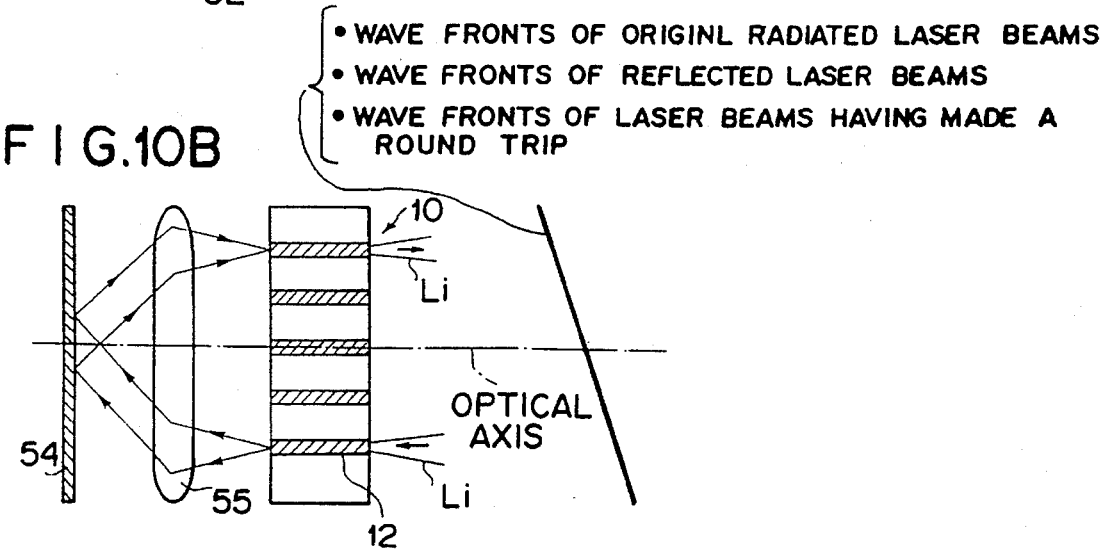
FIG. 10B is a schematic view showing an embodiment of the laser beam scanning radiating apparatus in accordance with the present invention, wherein the change in the phase distribution due to a round trip is compensated for by using a Fourier transform lens and a plane mirror.
Figure 10C:
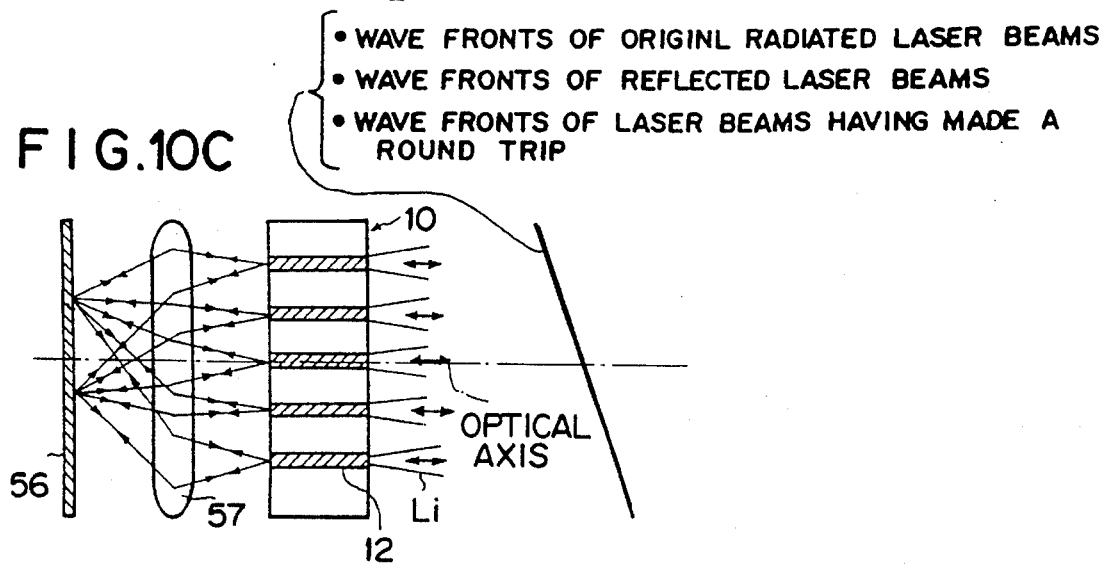
FIG. 10C is a schematic view showing an embodiment of the laser beam scanning radiating apparatus in accordance with the present invention, wherein the change in the phase distribution due to a round trip is compensated for by using a converging lens and a phase-conjugate mirror.

FIGS. 10A, 10B, and 10C show the embodiments of the laser beam scanning radiating apparatus in accordance with the present invention, wherein the phase distribution of the laser beams having made a round trip is caused to coincide with the phase distribution of the original radiated laser beams. Specifically, in the embodiment of FIG. 10A, collimator lenses 53, 53, . . . are located between the back end face of the array laser 10 and a second resonator mirror 51. The positions of the collimator lenses 53, 53, . . . are spaced a distance equal to their focal length away from the back end face of the array laser 10. Also, a prism 52 is located on the side rearward from the collimator lenses 53, 53, . . . The second resonator mirror 51 is located on the two reflecting surfaces of the prism 52 such that an incident laser beam Li can be radiated to the position symmetric with respect to the optical axis.

With this embodiment of the laser beam scanning radiating apparatus in accordance with the present invention, each of the laser beams Li, Li, . . . , which have made a round trip and are then radiated out of the array laser 10, is radiated from the position symmetric with respect to the optical axis. Therefore, the wave fronts of the laser beams Li, Li, . . . coincide with the wave fronts of the original radiated laser beams, and the amplification efficiency can be kept high.

Also, in the embodiment of FIG. 10B, a Fourier transform lens 55 is located between the back end face of the array laser 10 and a second resonator mirror 54 such that the Fourier transform plane of the Fourier transform lens 55 may coincide with the back end face of the array laser 10. In this manner, each of the laser beams Li, Li, . . . , which have been reflected by the first resonator mirror 42 and have thus been entered into the array laser 10, and which have then been radiated out of the back end face of the array laser 10, is reflected to the position symmetric with respect to the optical axis.

With the embodiment of FIG. 10B, each of the laser beams Li, Li, . . . , which have made a round trip and are then radiated out of the array laser 10, is radiated from the position symmetric with respect to the optical axis. Therefore, the wave fronts of the laser beams Li, Li, . . . coincide with the wave fronts of the original radiated laser beams, and the amplification efficiency can be kept high. The configurations of the lasers shown in FIGS. 10A and 10B are generally referred to as the ring laser configuration.

Further, in the embodiment of FIG. 10C, a converging lens 57 is used in lieu of the Fourier transform lens 55 in the configuration of FIG. 10B, and a phase-conjugate mirror 56 is used as the second resonator mirror. The phase-conjugate mirror 56 is located at a position sufficiently spaced away from the back end face of the array laser 10 (such that the laser beams radiated out of the back end face of the array laser 10 can be superposed one upon another).

The term "phase-conjugate mirror" as used herein means a mirror, which is constituted of a photo-refractive medium, such as $BaTiO_3$, and has the properties of phase compensation and time reflection, as described in, for example, R. A. Fisher, ed.: Optical Phase Conjugation (Academic, New York, 1983).

With the embodiment of FIG. 10C, each of the laser beams Li, Li, . . . , which have been reflected by the first resonator mirror 42 and have thus been entered into the array laser 10 and which have then impinged upon the phase-conjugate mirror 56, is subjected to the phase compensation and the time reflection by the phase-conjugate mirror 56 and thereafter returns to the original waveguide 12 of the array laser 10. Therefore, the wave fronts of the laser beams Li, Li, . . . coincide with the wave fronts of the original radiated laser beams, and the amplification efficiency can be kept high.

The phase distribution of the laser beams, which have made a round trip, can be caused to coincide with the phase distribution of the original laser beams without the special resonator mirror optical system being used at the rear of the array laser.

Figure 11:
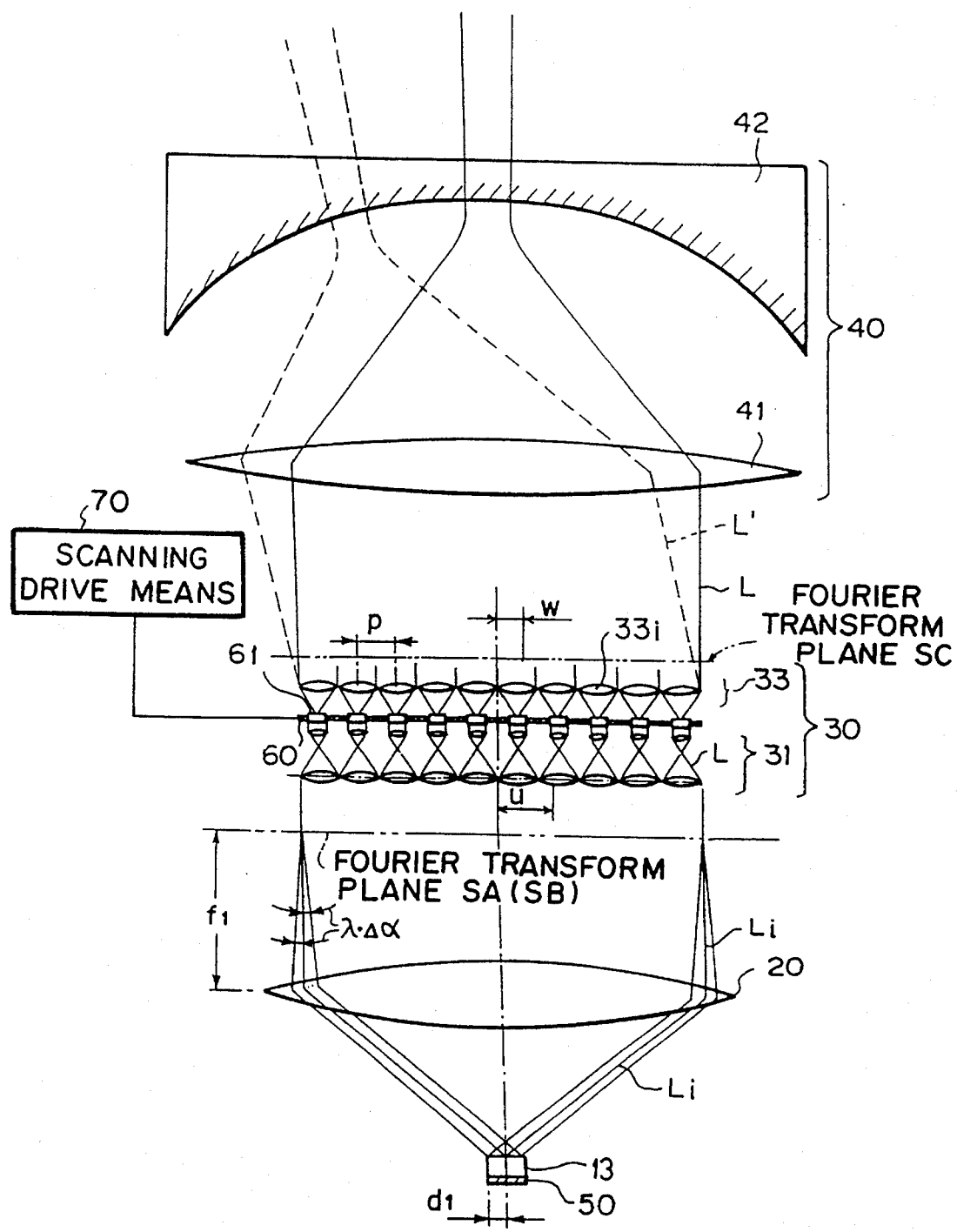
FIG. 11 is a schematic view showing an embodiment of the laser beam scanning radiating apparatus in accordance with the present invention, wherein a bulk-like laser medium is utilized as the laser beam source.

FIG. 11 is a schematic view showing an embodiment of the laser beam scanning radiating apparatus in accordance with the present invention, wherein a bulk-like laser medium 13, such as a solid laser medium, is utilized as the laser beam source in lieu of the array laser 10 comprising the plurality of the laser beam sources. The bulk-like laser medium 13 can radiate the laser beams from arbitrary continuous positions.

In Formula (6), the third term of the exponential function represents shift in the position of the laser beam radiating point. With the embodiment of FIG. 11, in cases where shift occurs in the position of the laser beam radiating point, the phase distribution of the laser beam patterns reproduced by the respective Fourier transform lens optical systems of the Fourier transform lens array optical system 30 has a predetermined angle of inclination with respect to the optical axis due to the shift in the position of the laser beam radiating point.

In the embodiment wherein the bulk-like laser medium 13 is utilized, the plurality of the laser beam radiating points are automatically shifted in the bulk-like laser medium 13 such that the phase distribution of the laser beams radiated out of the Fourier transform lens array 33 may be superposed upon the phase distribution, which is given from the phase modulating means 60 to the phase modulating elements 61, 61, . . . in order for the laser beams to be radiated with the same phase with respect to the direction inclined by a predetermined angle with respect to the optical axis direction of the resonator, and such that the laser beams may thus have the same phase as a whole with respect to the direction inclined by the predetermined angle. Therefore, the wave fronts of the laser beams, which have made a round trip, can be caused to coincide with the wave fronts of the original laser beams. The bulk-like laser medium 13 is stimulated in advance with stimulating rays, or the like.

In the embodiments described above, as an aid in facilitating the explanation, the array laser 10 is composed of the laser beam sources 11, 11, . . . located in a one-dimensional direction. However, the laser beam scanning radiating apparatus in accordance with the present invention is also applicable when the array laser is composed of the laser beam sources 11, 11, . . . located in a two-dimensional plane, which is normal to the optical axis. Further, the laser beam scanning radiating apparatus in accordance with the present invention is applicable when a two-dimensional bulk-like laser medium is employed. A laser beam scanning radiating apparatus, wherein the array laser is composed of the laser beam sources 11, 11, . . . located in a two-dimensional plane, will be described hereinbelow.

Figure 12A:
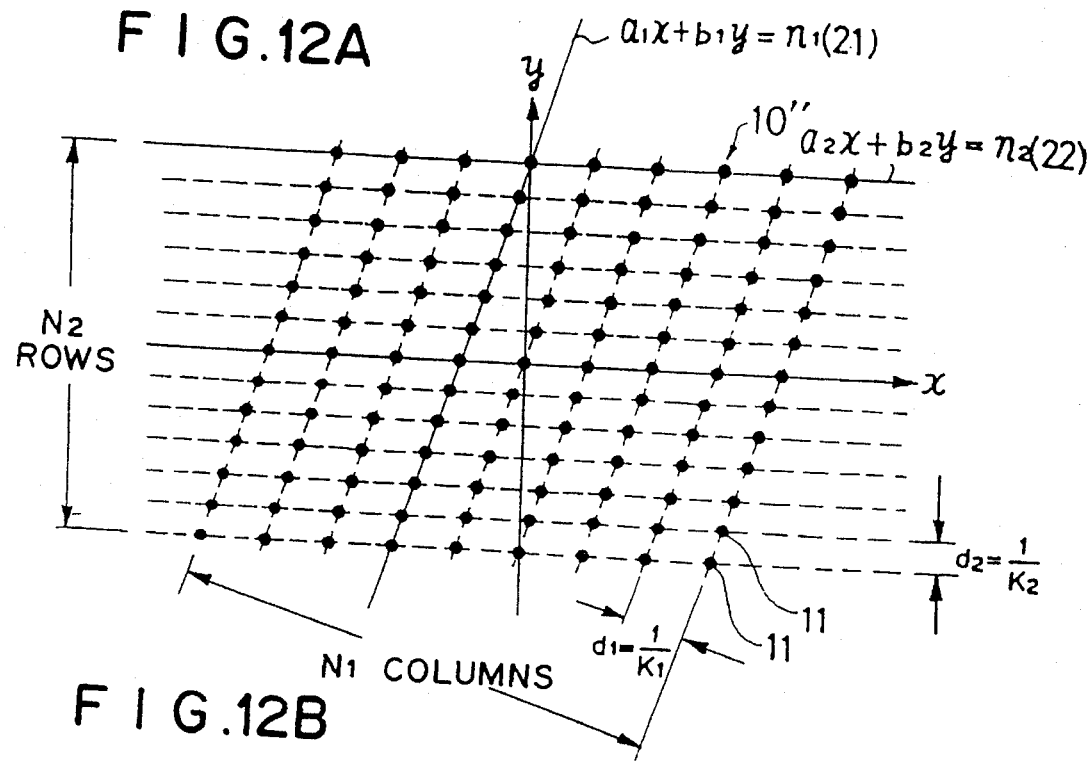
FIG. 12A is an explanatory view showing how a plurality of laser beam sources 11, 11, . . . constituting an array laser 10" are located in a two-dimensional plane (i.e. on an x-y coordinate system)

FIG. 12A is an explanatory view showing how a plurality of laser beam sources 11, 11, . . . constituting an array laser 10" are located in a two-dimensional plane (i.e. on an x-y coordinate system). In the array laser 10", the laser beam sources 11, 11, . . . are located in a skew periodic pattern. One of the skew lattice axes is taken as the x axis, and the laser beam source 11, which is present in the vicinity of the center of the array laser 10", is located at the origin. In such cases, it is assumed that the point of intersection of the skew lattice axes, i.e. each of the positions of the respective laser beam sources 11, 11, . . . , is set so as to satisfy the simultaneous equations of Formulas (21) and (22).

$$a_1x+b_1y=n_1n_1: \text{an integer} \quad (21)$$

$$a_2x+b_2y=n_2n_2: \text{an integer} \quad (22)$$

where $$a_1 = \frac{\alpha}{d_1\sqrt{1+\alpha^2}}, \ b_1 = -\frac{1}{d_1\sqrt{1+\alpha^2}}$$

$d_1$: the orthogonal distance between the skew lattice axes represented by Formula (21)

$\alpha$: the inclination of Formula (21) with respect to the x axis $$a_2 = 0, b_2 = -\frac{1}{d_2}$$

$d_2$: the orthogonal distance between the skew lattice axes represented by Formula (22)

FIG. 13 shows the laser beam scanning radiating apparatus, in which the array laser 10 in the laser beam scanning radiating apparatus of FIG. 1 is replaced by the array laser 10''. With reference to FIG. 13, the laser beams having been radiated out of the array laser 10'' are caused by the Fourier transform lens 20 to intersect one another and are superposed one upon another such that they have a predetermined angle difference with respect to one another on the Fourier transform plane SA of the Fourier transform lens 20 (on the $u_1$-$u_2$ coordinate system). In this manner, an interference pattern occurs. Far field patterns of the array laser 10'' are thus formed on the Fourier transform plane SA. The amplitude distribution $\psi_1(u_1, u_2)$ of the far field patterns of the array laser 10'' is represented by Formula (23).

$$\Psi_1(u_1, u_2) = \sum_{n1=-N1a}^{N1b} \sum_{n2=-N2a}^{N2b} A_{n1,n2} \exp(i\phi_{n1,n2}) \cdot \qquad (23)$$

$$\exp\left[-2\pi i \left\{ \frac{d_1}{\lambda f_1} \left(\frac{\sqrt{1+\alpha^2}}{\alpha} u_1\right) n_1 - \frac{d_2}{\lambda f_1} \left(\frac{u_1}{\alpha} + u_2\right) n_2 \right\}\right]$$

where $A_{n1,n2}$: the amplitude of each laser beam $L_{n1,n2}$ $\phi_{n1,n2}$: the phase of each laser beam $L_{n1,n2}$ $N_1 = N_{1b} + N_{1a} + 1$: the laser array number in the x axis direction $N_2 = N_{2b} + N_{2a} + 1$: the laser array number in the y axis direction $f_1$: the focal length of the Fourier transform lens 20

According to Formula (23), the amplitude distribution $\psi_1(u_1, u_2)$ becomes the periodic distribution having peaks on the reciprocal lattice with respect to the skew lattice, which is the pattern of the array laser 10''. The position representing each peak is given by the solutions of the simultaneous equations of Formulas (24) and (25).

$$-\frac{b_1}{\Delta} \frac{u_1}{\lambda f_1} + \frac{a_1}{\Delta} \frac{u_2}{\lambda f_1} = J_1 \quad J_1: \text{an integer} \qquad (24)$$

$$\frac{b_2}{\Delta} \frac{u_1}{\lambda f_1} - \frac{a_2}{\Delta} \frac{u_2}{\lambda f_1} = J_2 \quad J_2: \text{an integer} \qquad (25)$$

$$\Delta = a_1 b_2 - a_2 b_1$$

Figure 12B:
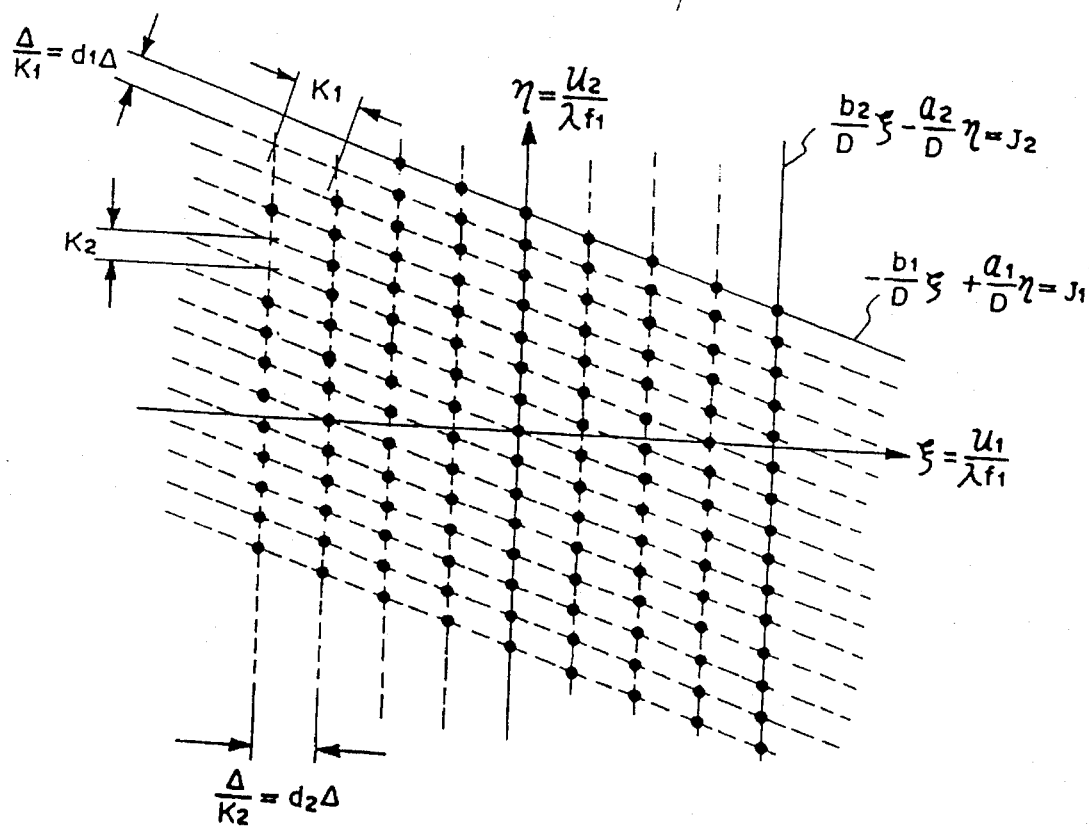
FIG. 12B is an explanatory view showing the positions of peaks of an amplitude distribution $\psi_1(u_1, u_2)$ of far field patterns of the array laser 10" on a Fourier transform plane (i.e. on a $u_1$-$u_2$ coordinate system)

The positions of the peaks on the Fourier transform plane SA (the $u_1$-$u_2$ coordinate system) are shown in FIG. 12B. The orthogonal distance between the reciprocal lattice axes is represented by Formulas (26) and (27).

$$D_1 = \frac{|\Delta|}{k_1} = d_1|\Delta|: \text{the orthogonal distance between the reciprocal lattice axes represented by Formula (24)} \qquad (26)$$

$$D_2 = \frac{|\Delta|}{k_2} = d_2|\Delta|: \text{the orthogonal distance between the reciprocal lattice axes represented by Formula (25)} \qquad (27)$$

where $$k_1 = \sqrt{a_1^2 + b_1^2} = \frac{1}{d_1}$$

$$k_2 = \sqrt{a_2^2 + b_2^2} = \frac{1}{d_2}$$

Therefore, a phase modulating means 60'' comprising an array of the phase modulating elements 61, 61, . . . and a Fourier transform lens array optical system 30'' (or a Fourier transform lens array 33'), which have a periodic structure similar to the reciprocal lattice, may be located such that the front Fourier transform plane SB may coincide with the $u_1$-$u_2$ coordinate plane SA. In such cases, the far field patterns of the array laser 10'' having a periodic distribution with the peaks on the reciprocal lattice are divided into a plurality of small regions. Also, near field patterns of the array laser 10'' are reproduced for the respective small regions on the back Fourier transform plane SC (the $w_1$-$w_2$ coordinate system) of the Fourier transform lens array optical system 30''. (In FIG. 13, the phase modulating means 60'' and the Fourier transform lens array optical system 30'' are shown in the simplified form.) The amplitude distribution $\psi_2(W_1, W_2)$ of the reproduced near field patterns of the array laser 10'' on the back Fourier transform plane SC of the Fourier transform lens array optical system 30'' is represented by Formula (28).

$$\Psi_2(w_1, w_2) = \frac{\sqrt{1+\alpha^2}}{|\alpha|} P_1 P_2 \sum_{l1=-L1}^{L1} \sum_{l2=-L2}^{L2} \sum_{n1=-N1a}^{N1b} \sum_{n2=-N2a}^{N2b} \qquad (28)$$

$$A_{n1,n2} \exp(i\phi_{n1,n2}) \cdot$$

$$\exp\left[2\pi i \frac{\sqrt{1+\alpha^2}}{\alpha} \left(\frac{d_2 P_1}{\lambda f_1} l1 n1 - \frac{d_1 P_2}{\lambda f_1} l2 n2\right)\right] \cdot$$

$$\exp\left[-2\pi i \frac{\delta_2 f_1 d_1 d_2}{f_2} \frac{\sqrt{1+\alpha^2}}{\alpha} (B_1 w_1 + B_2 w_2 + B_3)\right] \cdot$$

$$\exp\left[-2\pi i \frac{\delta_1 f_1 d_1 d_2}{f_2} \frac{\sqrt{1+\alpha^2}}{\alpha} (B_4 w_2 + B_5)\right] \cdot$$

$$\mathrm{sinc}\left[-\frac{d_1 P_2}{\lambda f_1} \frac{\sqrt{1+\alpha^2}}{\alpha} \cdot \left\{\frac{f_1}{f_2}(B_1 w_1 + B_2 w_2 + B_3) + n_2\right\}\right] \cdot$$

$$\mathrm{sinc}\left[-\frac{d_2 P_1}{\lambda f_1} \frac{\sqrt{1+\alpha^2}}{\alpha} \cdot \left\{\frac{f_1}{f_2}(B_4 w_2 + B_5) + n_1\right\}\right]$$

where $$B_1 = \frac{\alpha}{d_1\sqrt{1+\alpha^2}}, \quad B_2 = \frac{1}{d_1\sqrt{1+\alpha^2}}$$

$$B_3 = \frac{d_1 d_2 \sqrt{1+\alpha^2}}{\alpha} \left\{ \frac{1}{d_1 d_2 \sqrt{1+\alpha^2}} \left( \frac{P_1 l_1}{d_1} + \delta_1 \lambda f_1 \right) - \frac{1}{d_1^2} \left( \frac{P_2 l_2}{d_2} - \delta_2 \lambda f_1 \right) \right\}$$

$$B_4 = -\frac{1}{d_2}$$

$$B_5 = \frac{d_1 d_2 \sqrt{1+\alpha^2}}{\alpha} \left\{ \frac{1}{d_2^2} \left( \frac{P_1 l_1}{d_1} + \delta_1 \lambda f_1 \right) - \frac{1}{d_1 d_2 \sqrt{1+\alpha^2}} \left( \frac{P_2 l_2}{d_2} - \delta_2 \lambda f_1 \right) \right\}$$

$f_2$: the focal length of the Fourier transform lens array optical system $\delta_1, \delta_2$: the amount of shift of the Fourier transform lens array optical system with respect to the array laser wherein each of $P_1$ and $P_2$ represents the orthogonal distance between the skew lattice axes representing the periodic structure of the lens array.

$P_1$: the orthogonal distance between the axes parallel to Formula (24)

$P_2$: the orthogonal distance between the axes parallel to Formula (25)

The array pitch of the Fourier transform lens array optical system 30" and the variation of the angular spectrum of the laser beam radiated out of each of the laser beam sources 11, 11, . . . of the array laser 10" are set so as to satisfy the relationship of Formulas (29) and (30). Formulas (29) and (30) indicate that the array pitches $P_1$ and $P_2$ in two directions of the Fourier transform lens array optical system 30", which has the periodic structure similar to the reciprocal lattice with respect to the skew lattice pattern of the array laser 10", coincide with integral multiples of the pitches in the corresponding directions of the interference fringes, which are projected onto the Fourier transform plane SA of the Fourier transform lens 20 and have periodic peaks on the reciprocal lattice.

$$\frac{d_2 P_1}{\lambda f_1} \frac{\sqrt{1+\alpha^2}}{\alpha} = I_1 \quad (29)$$

$$\frac{d_1 P_2}{\lambda f_1} \frac{\sqrt{1+\alpha^2}}{\alpha} = I_2 \quad (30)$$

where each of $I_1$ and $I_2$ represents an integer other than 0.

Therefore, Formula (28) can be modified into Formula (31) shown below. The amount of shift is set such that $\delta_1 = 0$ and $\delta_2 = 0$ by assuming that the interference fringes of the array laser 10" projected onto the Fourier transform plane SA of the Fourier transform lens 20 involve no shift with respect to the Fourier transform lens array optical system 30".

$$\Psi_2(w_1, w_2) = \frac{\sqrt{1+\alpha^2}}{|\alpha|} P_1 P_2 \sum_{l1=-L1}^{L1} \sum_{l2=-L2}^{L2} \sum_{n1=N1a}^{N1b} \sum_{n2=N2a}^{N2b} \quad (31)$$

$$A_{n1,n2} \exp(i\phi_{n1,n2}) \cdot$$

$$\mathrm{sinc}\left[ \frac{P_2}{\lambda f_2} \left\{ w_1 - \frac{1}{\alpha} w_2 + \frac{f_2}{f_1} \frac{\sqrt{1+\alpha^2}}{\alpha} d_1 n_2 + \frac{\sqrt{1+\alpha^2}}{\alpha^2} P_1 l_1 - \frac{1+\alpha^2}{\alpha^2} P_2 l_2 \right\} \right] \cdot$$

$$\mathrm{sinc}\left[ \frac{P_1}{\lambda f_2} \frac{\sqrt{1+\alpha^2}}{\alpha} \left\{ w_2 - \frac{f_2}{f_1} d_2 n_1 - \frac{\sqrt{1+\alpha^2}}{\alpha} P_1 l_1 + \frac{1}{\alpha} P_2 l_2 \right\} \right]$$

Such that the near field patterns of the array laser 10" reproduced on the back Fourier transform plane SC (the $w_1 w_2$ coordinate system) may stand in a line at a predetermined pitch in each direction, it is necessary for Formulas (32), (33), and (34) to be satisfied.

$$\frac{f_2}{f_1} d_1 N_1 = P_2 \frac{\sqrt{1+\alpha^2}}{\alpha} \quad (32)$$

$$\frac{f_2}{f_1} d_2 N_2 = P_1 \frac{\sqrt{1+\alpha^2}}{\alpha} \quad (33)$$

$$\alpha = \sqrt{\left( \frac{2\lambda f_1^2}{f_2 d_1 d_2 H} \right)^2 - 1} \quad (34)$$

where H represents an integer.

Formula (34) represents the conditions such that no shift may occur between the adjacent reproduced near field patterns of the array laser 10".

In cases where the laser beam positions in the near field patterns of the array laser 10" reproduced on the back Fourier transform plane SC of the Fourier transform lens array optical system 30" overlap one upon another, it is necessary for the gain (laser beam output power) of each laser beam source 11 to be controlled such that the optical intensity may become uniform as a whole on the back Fourier transform plane SC of the Fourier transform lens array optical system 30".

Also, such that the intensity distribution of the laser beam radiated out of the Fourier transform lens array optical system 30" may become approximately perfectly single-lobed at the far field, it is necessary to set in Formulas (29) and (30) such that $I_1=1$ and $I_2=1$.

The laser beam sources 11, 11, . . . of the array laser need not necessarily be located periodically in each of two different directions in the manner described above. For example, as illustrated in FIG. 14, an array laser 10" may be composed of the laser beam sources located periodically at least in a single direction. In such cases, the far field patterns having a periodic array structure corresponding to the structure of the array laser 10" are formed on the Fourier transform plane SA of the Fourier transform lens 20. A phase modulating means 60" and a Fourier transform lens array 33" having the structure corresponding to the array structure of the far field patterns are located such that the front Fourier transform plane SB may coincide with the Fourier transform plane SA of the Fourier transform lens 20. In this manner, the near field patterns of the array laser 10" are reproduced sufficiently close to one another as a whole on the back Fourier transform plane SC of the Fourier transform lens array 33". In cases where the near field patterns are thus reproduced sufficiently close to one another, the laser beams having been reflected by the laser resonator mirror optical system can be optically coupled with one another. Therefore, the laser beams having been produced by the array laser can be coherently combined with one another and radiated out. Also, the desired phase modulation is carried out, and the laser beam can thereby be scanned to a desired position on the optical axis of the resonator.

What is claimed is:

1. A laser beam scanning radiating apparatus comprising:
   i) a laser beam source which emits a plurality of laser beams at a wavelength such that the laser beams intersect one another with predetermined angular spectra on a predetermined virtual plane through which the laser beams pass;
   ii) a transform optical system including a beam expander array dividing the laser beams having impinged upon the virtual plane into small regions and a Fourier transform lens array which carries out Fourier transforms of the small regions, said transform optical system being located in the vicinity of the virtual plane such that a front Fourier transform plane of said transform optical system substantially coincides with the virtual plane;
   iii) phase modulating means for modulating each of the phases of the laser beams having been divided into the small regions by said beam expander array, said phase modulating means being positioned between said beam expander array and said Fourier transform lens array such that wave fronts of the plurality of the laser beams subjected to the Fourier transform by said Fourier transform lens array in said transform optical system are continuously smoothly connected with one another;
   iv) scanning drive means for driving said phase modulating means in order to change directions of travel of the laser beams emitted from said transform optical system; and
   v) a laser resonator mirror optical system including,
      a) a first laser resonator mirror, which receives the laser beams having been scanned by said scanning drive means, and which reflects said laser beams having been scanned back towards said transform optical system, and
      b) a second laser resonator mirror, which is located at a position rearward from said laser beam source,
   wherein a plurality of Fourier transformed patterns of the laser beams are reproduced on the Fourier transform plane of said transform optical system at equal intervals and with a same phase with respect to a predetermined direction.

2. An apparatus as defined in claim 1, wherein a product of the array pitch of said transform optical system and a variation of an angular spectrum of each of the laser beams at the respective positions at which the laser beams intersect one another, is within the range of larger than 0 to smaller than 2, such that an intensity distribution pattern of the combined laser beam, which occurs from optical coupling of the plurality of the laser beams by said transform optical system, said phase modulating means and said laser resonator mirror optical system, becomes substantially single-lobed.

3. An apparatus as defined in claim 2 further comprising a Fourier transform lens located between the back end face of said laser beam source and said second laser resonator mirror such that a Fourier transform plane of said Fourier transform lens coincides with the back end face of said laser beam source, wherein each of the laser beams reflected by said first laser resonator mirror, entered into said laser beam source, and emitted from the back end face of said laser beam source, is reflected and again enters the back end face of said laser beam source via said Fourier transform lens and said second laser resonator mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

4. An apparatus as defined in claim 2, further comprising a collimator lens array and a prism located between the back end face of said laser beam source and said second laser resonator mirror, said second laser resonator mirror being located on reflecting surfaces of said prism, wherein each of the laser beams reflected by said first laser resonator mirror, entered into said laser beam source, and emitted from the back end face of said laser beam source, is reflected and again enters the back end face of said laser beam source via said collimator lens array and said prism as a phase-conjugate laser beam, and is thereafter emitted from a front end face of said laser beam source as a laser beam which is a phase-conjugate of the laser beam reflected by said first laser resonator mirror and emitted from the back end face of said laser beam source.

5. An apparatus as defined in claim 2, wherein said second laser resonator mirror includes a phase-conjugate mirror and a converging optical system located between the back end face of said laser beam source and said phase-conjugate mirror, wherein each of the laser beams reflected by said first laser resonator mirror, entered into said laser beam source, and emitted from the back end face of said laser beam source, is reflected and again enters the back end face of said laser beam source via said converging optical system and said phase-conjugate mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

6. An apparatus as defined in claim 1, wherein said laser beam source is an array laser beam source including an array of a plurality of laser beam sources, which respectively emit the laser beams.

7. An apparatus as defined in claim 6, further comprising a Fourier transform lens located between the back end face of said laser beam source and said second laser resonator mirror such that a Fourier transform plane of said Fourier transform lens coincides with the back end face of said laser beam source, wherein each of the laser beams reflected by said first laser resonator mirror, entered into said laser beam source, and emitted from the back end face of said laser beam source, is reflected and again enters the back end face of said laser beam source via said Fourier transform lens and said second laser resonator mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

8. An apparatus as defined in claim 6, further comprising a collimator lens array and a prism located between the back end face of said laser beam source and said second laser resonator mirror, said second laser resonator mirror being located on reflecting surfaces of said prism, wherein each of the laser beams reflected by said first laser resonator mirror, entered into said laser beam source, and emitted from the back end face of said laser beam source, is reflected and again enters the back end face of said laser beam source via said collimator lens array and said prism as a phase-conjugate laser beam, and is thereafter emitted from a front end face of said laser beam source as a laser beam which is a phase-conjugate of the laser beam reflected by said first laser resonator mirror and emitted from the back end face of said laser beam source.

9. An apparatus as defined in claim 6, wherein said second laser resonator mirror includes a phase-conjugate mirror and a converging optical system located between the back end face of said laser beam source and said phase-conjugate mirror, wherein each of the laser beams reflected by said first laser resonator mirror, entered into said laser beam source, and emitted from the back end face of said laser beam source, is reflected and again enters the back end face of said laser beam source via said converging optical system and said phase-conjugate mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

10. An apparatus as defined in claim 6, wherein said laser beam source includes a plurality of laser beam sources arranged in a skew lattice pattern in a plane normal to the optical axis, said laser beam source emitting the plurality of the laser beams from positions located in the skew lattice pattern, and said Fourier transform lens array and said beam expander array of said transform optical system, and phase modulating elements of said phase modulating means are arrayed in a lattice pattern reciprocal with the skew lattice pattern of the laser beam emitting positions.

11. An apparatus as defined in claim 1, wherein said laser beam source is a bulk-like laser beam source capable of emitting the laser beams from arbitrary positions lying in a plane, which is parallel to said predetermined virtual plane.

12. An apparatus as defined in claim 11, further comprising a Fourier transform lens is located between the back end face of said laser beam source and said second laser resonator mirror such that a Fourier transform plane of said Fourier transform lens coincides with the back end face of said laser beam source, wherein each of the laser beams reflected by said first laser resonator mirror, entered into said laser beam source, and emitted from the back end face of said laser beam source, is reflected and again enters the back end face of said laser beam source via said Fourier transform lens and said second laser resonator mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

13. An apparatus as defined in claim 11, further comprising a collimator lens array and a prism located between the back end face of said laser beam source and said second laser resonator mirror, said second laser resonator mirror being located on reflecting surfaces of said prism, wherein each of the laser beams reflected by said first laser resonator mirror, entered into said laser beam source, and emitted from the back end face of said laser beam source, is reflected and again enters the back end face of said laser beam source via said collimator lens array and said prism as a phase-conjugate laser beam, and is thereafter emitted from a front end of said laser beam source as a laser beam which is a phase-conjugate of the laser beam reflected by said first laser resonator mirror and emitted from the back end face of said laser beam source.

14. An apparatus as defined in claim 11, wherein said second laser resonator mirror includes a phase-conjugate mirror and a converging optical system located between the back end face of said laser beam source and said phase-conjugate mirror, wherein each of the laser beams reflected by said first laser resonator mirror, entered into said laser beam source, and emitted from the back end face of said laser beam source, is reflected and again enters the back end face of said laser beam source via said converging optical system and said phase-conjugate mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

15. An apparatus as defined in claim 11, wherein said laser beam source includes a plurality of laser beam sources arranged in a skew lattice pattern in a plane normal to the optical axis, said laser beam source emitting the plurality of the laser beams from positions located in the skew lattice pattern, and said Fourier transform lens array and said beam expander array of said transform optical system, and phase modulating elements of said phase modulating means are arrayed in a lattice pattern reciprocal with the skew lattice pattern of the laser beam emitting positions.

16. An apparatus as defined in claim 1, further comprising a Fourier transform lens located between the back end face of said laser beam source and said second laser resonator mirror such that a Fourier transform plane of said Fourier transform lens coincides with the back end face of said laser beam source, wherein each of the laser beams reflected by said first laser resonator mirror, entered into said laser beam source, and emitted from the back end face of said laser beam source, is reflected and again enters the back end face of said laser beam source via said Fourier transform lens and said second laser resonator mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

17. An apparatus as defined in claim 1, further comprising a collimator lens array and a prism located between the back end face of said laser beam source and said second laser resonator mirror, said second laser resonator mirror being located on reflecting surfaces of said prism, wherein each of the laser beams reflected by said first laser resonator mirror, entered into said laser beam source, and emitted from the back end face of said laser beam source, is reflected and again enters the back end face of said laser beam source via said collimator lens array and said prism as a phase-conjugate laser beam, and is thereafter emitted from a front end face of said laser beam source as a laser beam which is a phase-conjugate of the laser beam reflected by said first laser resonator mirror and emitted from the back end face of said laser beam source.

18. An apparatus as defined in claim 1, wherein said second laser resonator mirror includes a phase-conjugate mirror and a converging optical system located between the back end face of said laser beam source and said phase-conjugate mirror, wherein each of the laser beams reflected by said first laser resonator mirror, entered into said laser beam source, and emitted from the back end face of said laser beam source, is reflected and again enters the back end face of said laser beam source via said converging optical system and said phase-conjugate mirror as a phase-conjugate laser beam, and is thereafter emitted from a front end face of said laser beam source as a laser beam which is a phase-conjugate of the laser beam reflected by said first laser resonator mirror and emitted from the back end face of said laser beam source.

19. An apparatus as defined in claim 1, wherein said laser beam source includes a plurality of laser beam sources arranged in a skew lattice pattern in a plane normal to the optical axis, said laser beam source emitting the plurality of the laser beams from positions located in the skew lattice pattern, and said Fourier transform lens array and said beam expander array of said transform optical system, and phase modulating elements of said phase modulating means are arrayed in a lattice pattern reciprocal with the skew lattice pattern of the laser beam emitting positions.

20. An apparatus as defined in claim 1, wherein the plurality of Fourier transformed patterns of the laser beams are reproduced on the Fourier transform plane of said transform optical system at equal intervals and with a same phase with respect to a predetermined direction by appropriate selection of each of the following parameters: a focal length of said transform optical system, an array pitch of said transform optical system, a number of the plurality of the laser beams emitted by said laser beam source, the wavelength of the laser beam source, and the variation of the angular spectrum of each of the laser beams at the respective positions at which the laser beams intersect one another.

21. An apparatus as defined in claim 20, wherein said plurality of Fourier transformed patterns are reproduced at equal intervals and with a same phase with respect to a predetermined direction by providing elements of the apparatus which satisfy the following equations:

$I = p\Delta\alpha$ $p = \lambda\Delta\alpha f_2 N$ where I is an integer other than 0, p is the lens pitch of the transform optical system, $\lambda$ is the wavelength of the laser beam source, $\Delta\alpha$ is the variation in angular spectrum, $f_2$ is the focal length of the transform optical system and N is the number of the laser beams.

22. An apparatus as defined in claim 21, wherein said apparatus further comprises a Fourier transform lens situated between said laser beam source and said transform optical system, and wherein said laser beam source is an array laser, and wherein said variation in angular spectrum is defined as $$\Delta\alpha = \frac{d_1}{\lambda f_1},$$

where $f_1$ is a focal length of said Fourier transform lens, and $d_1$ is an array pitch of said array laser.

23. An apparatus as defined in claim 1, wherein said first laser resonator mirror is a planar mirror.

24. A method of scanning a laser beam at equal intervals and with a same phase with respect to a predetermined direction comprising the steps of:

emitting a plurality of laser beams at a wavelength;

intersecting the laser beams with one another with predetermined angular spectra on a predetermined virtual plane through which the laser beams pass;

dividing the laser beams having impinged upon the virtual plane into small regions using a beam expander array;

Fourier transforming the small regions using a Fourier transform lens array;

locating a transform optical system including the beam expander array and the transform lens array in the vicinity of the virtual plane such that a front Fourier transform plane of said transform optical system substantially coincides with the virtual plane;

modulating each of the phases of the laser beams having been divided into the small regions such that wave fronts of the plurality of the laser beams subjected said Fourier transforming step are continuously smoothly connected with one another;

driving said modulating means step in order to change directions of travel of the laser beams emitted from the transform optical system;

reflecting, after said driving step, the laser beams back towards the transform optical system;

positioning a laser resonator mirror rearward from said laser beam source; and reproducing a plurality of Fourier transformed patterns of the laser beams at equal intervals and with a same phase with respect to a predetermined direction of the Fourier transform plane of said transform optical system by selecting appropriate values for the following parameters: a focal length of the transform optical system, an array pitch of the transform optical system, a number of the plurality of the laser beams, a wavelength of the laser beams, and the variation of the angular spectrum of each of the laser beams at the respective positions at which the laser beams intersect one another.

* * * * *